(12) United States Patent
Kim et al.

(10) Patent No.: US 11,828,969 B2
(45) Date of Patent: Nov. 28, 2023

(54) LIGHTING MODULE AND LIGHTING DEVICE COMPRISING SAME

(71) Applicant: LG INNOTEK CO., LTD., Seoul (KR)

(72) Inventors: Seong Jin Kim, Seoul (KR); Hyun Ho Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/986,227

(22) Filed: Nov. 14, 2022

(65) Prior Publication Data

US 2023/0070602 A1 Mar. 9, 2023

Related U.S. Application Data

(63) Continuation of application No. 17/438,504, filed as application No. PCT/KR2020/003810 on Mar. 19, 2020, now Pat. No. 11,543,579.

(30) Foreign Application Priority Data

Mar. 22, 2019 (KR) .................. 10-2019-0033183

(51) Int. Cl.
*F21V 8/00* (2006.01)
*F21K 9/61* (2016.01)
(Continued)

(52) U.S. Cl.
CPC .............. *G02B 6/0045* (2013.01); *F21K 9/61* (2016.08); *G02B 6/0021* (2013.01);
(Continued)

(58) Field of Classification Search
CPC ......... F21K 9/61; F21S 43/239; F21S 43/243; G02B 6/0021; G02B 6/0028; G02B 6/003;
(Continued)

(56) References Cited

U.S. PATENT DOCUMENTS 8,247,831 B2   8/2012 Jagt
9,978,917 B1   5/2018 Ye et al.
(Continued)

FOREIGN PATENT DOCUMENTS

CN   101876407    11/2010
CN   101868865     8/2012
(Continued)

OTHER PUBLICATIONS

English Translation of ISA Written Opinion of PCT/KR2020/003810 (Year: 2019).*

(Continued)

*Primary Examiner* — Keith G. Delahoussaye
(74) *Attorney, Agent, or Firm* — KED & ASSOCIATES, LLP

(57) ABSTRACT

A lighting device disclosed in an embodiment of the invention includes a substrate; a plurality of light emitting devices on the substrate; a first reflective layer on the substrate; a resin layer on the first reflective layer; and a second reflective layer on the resin layer. The resin layer includes a first surface from which light emitted from the plurality of light emitting devices is emitted, and a second surface opposite to the first surface, wherein the first surface of the resin layer includes a first exit surface having a first curvature, and a second exit surface having a flat surface or a second curvature, wherein a maximum distance from the second surface to the first exit surface may be greater than a maximum distance from the second surface to the second exit surface.

20 Claims, 13 Drawing Sheets

(51) Int. Cl.
*H01L 33/60* (2010.01)
*H05K 1/18* (2006.01)

(52) U.S. Cl.
CPC ......... *G02B 6/0055* (2013.01); *G02B 6/0066* (2013.01); *H01L 33/60* (2013.01); *H05K 1/181* (2013.01)

(58) Field of Classification Search
CPC ... G02B 6/0031; G02B 6/0045; G02B 6/0055
See application file for complete search history.

(56) References Cited

U.S. PATENT DOCUMENTS

| | | | |
|---|---|---|---|
| 10,527,250 | B2 | 1/2020 | Cho et al. |
| 10,753,546 | B2 | 8/2020 | Hwang et al. |
| 11,125,396 | B2 | 9/2021 | Hwang et al. |
| 2007/0030676 | A1 | 2/2007 | Ichihara |
| 2008/0186733 | A1* | 8/2008 | Ho .................. H01L 33/54 257/E33.059 |
| 2011/0220927 | A1 | 9/2011 | Min |
| 2015/0241616 | A1 | 8/2015 | Bungenstock |
| 2019/0137046 | A1 | 5/2019 | Hwang et al. |
| 2020/0332966 | A1 | 10/2020 | Hwang et al. |

FOREIGN PATENT DOCUMENTS

| | | |
|---|---|---|
| CN | 102865499 | 1/2013 |
| CN | 202995072 | 6/2013 |
| CN | 108666407 | 10/2018 |
| CN | 109416163 | 3/2019 |
| DE | 10-2011-002340 | 10/2012 |
| JP | 2007-158009 | 6/2007 |
| JP | 2011-233416 | 11/2011 |
| KR | 10-2013-00684 95 | 6/2013 |
| KR | 10-2014-0047412 | 4/2014 |
| KR | 10-2015-00257 28 | 3/2015 |
| KR | 10-2016-0047249 | 5/2016 |

OTHER PUBLICATIONS

Chinese Office Action dated Dec. 21, 2022 issued in CN Application No. 202080023356.0.
International Search Report dated Jul. 6, 2020 issued in Application No. PCT/KR2020/003810.
U.S. Office Action dated May 22, 2022 issued in U.S. Appl. No. 17/438,504.
European Search Report dated Nov. 2, 2022 issued in EP Application No. 20779625.1.

* cited by examiner

LIGHTING MODULE AND LIGHTING DEVICE COMPRISING SAME

CROSS-REFERENCE TO RELATED APPLICATIONS

This application is a Continuation Application of U.S. patent application Ser. No. 17/438,504 filed Sep. 13, 2021, which is a U.S. National Stage Application under 35 U.S.C. § 371 of PCT Application No. PCT/KR2020/003810, filed Mar. 19, 2020, which claims priority to Korean Patent Application No. 10-2019-0033183, filed Mar. 22, 2019, whose entire disclosures are hereby incorporated by reference.

BACKGROUND

1. Field

An embodiment of the invention relates to a lighting device having a plurality of light sources or light emitting devices. An embodiment of the invention relates to a lighting device that provides a surface light source in the form of a line. An embodiment relates to a lighting device having a lighting module. The embodiment relates to a light unit having a lighting module, a liquid crystal display device, or a vehicle lamp.

2. Background

Lighting applications include vehicle lights as well as backlights for displays and signs. Light emitting device, such as light emitting diode (LED), have advantages such as low power consumption, semi-permanent life, fast response speed, safety, and environmental friendliness compared to conventional light sources such as fluorescent lamps and incandescent lamps. These light emitting diodes are applied to various display devices, various lighting devices such as indoor or outdoor lights. Recently, as a vehicle light source, a lamp employing a light emitting diode has been proposed. Compared with incandescent lamps, light emitting diodes are advantageous in that power consumption is small. However, since an exit angle of light emitted from the light emitting diode is small, when the light emitting diode is used as a vehicle lamp, there is a demand for increasing the light emitting area of the lamp using the light emitting diode. Since the light emitting diode is small, it may increase the design freedom of the lamp, and it is economical due to its semi-permanent life.

BRIEF DESCRIPTION OF THE DRAWINGS

The embodiments will be described in detail with reference to the following drawings in which like reference numerals refer to like elements wherein.

DETAILED DESCRIPTION

Figure 1:
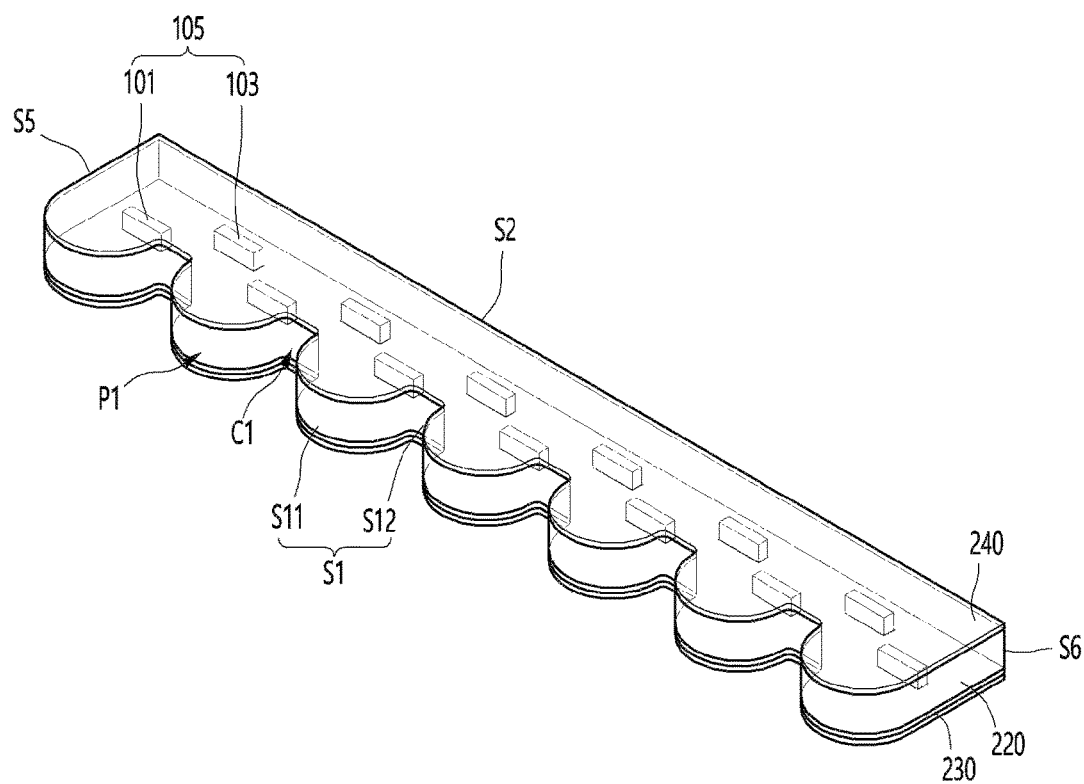
FIG. 1 is a perspective view showing a lighting device according to an embodiment of the invention.
Figure 1:
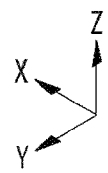

Hereinafter, with reference to the accompanying drawings, a preferred embodiment in which a person of ordinary skill in the art to which the invention pertains can easily practice the invention will be described in detail. However, it should be understood that the configuration shown in the embodiments and drawings described in this specification is only a preferred embodiment of the invention, and there may be various equivalents and modifications that can be substituted for them at the time of the present application.

In the detailed description of the operating principle of the preferred embodiment of the invention, if it is determined that a detailed description of a related well-known function or configuration may unnecessarily obscure the subject matter of the invention, the detailed description thereof will be omitted. The terms described below are terms defined in consideration of functions in the invention, and the meaning of each term should be interpreted based on the content throughout this specification. The same reference numerals are used throughout the drawings to refer to parts having similar functions and functions.

The lighting device according to the invention may be applied to various lamp devices that require lighting, such as vehicle lamps, household lighting devices, and industrial lighting devices. For example, when applied to vehicle lamps, head lamps, car lights, side mirror lights, fog lights, tail lamps, brake lights, daytime running lights, vehicle interior lights, door scars, rear combination lamps, backup lamps, it is applicable to back. The lighting device of the invention may be applied to indoor and outdoor advertising devices, display devices, and various electric vehicle fields. In addition, it may be applied to all lighting-related fields or advertising-related fields that are currently developed and commercialized or may be implemented according to future technological development.

Hereinafter, the embodiments will be apparent through the description of the accompanying drawings and embodiments. In the description of the embodiments, each layer (film), region, pattern or structure is formed "on" or "under" of the substrate, each layer (film), region, pad or patterns. In the case described as, "on" and "under" include both "directly" or "indirectly" formed through another layer. In addition, the criteria for the top or bottom of each layer will be described based on the drawings.

Lighting Device

Figure 2:
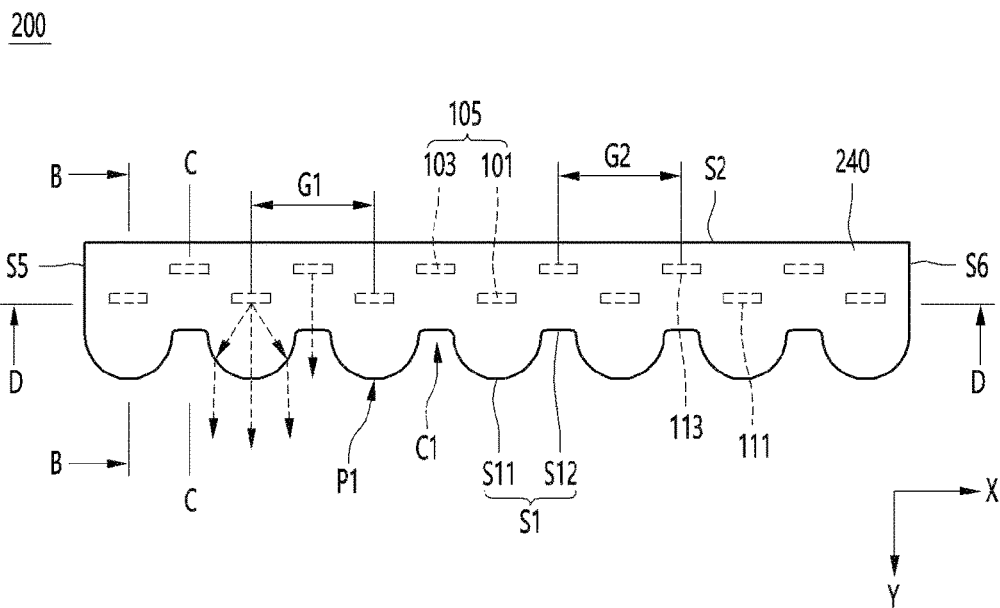
FIG. 2 is a plan view of the lighting device of FIG. 1.
Figure 3:
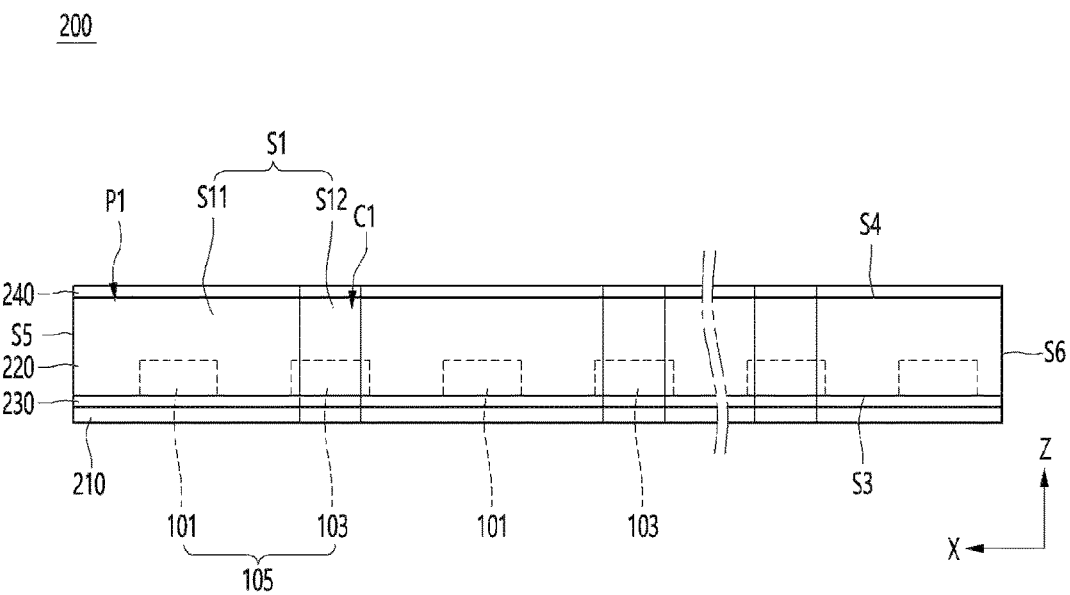
FIG. 3 is a front view of the lighting device of FIG. 1.
Figure 4:
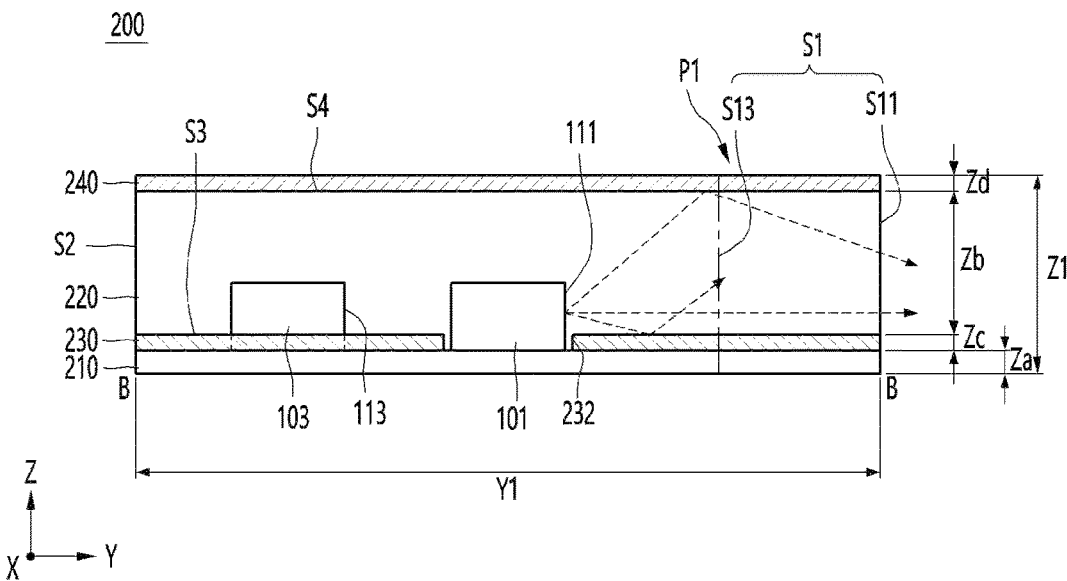
FIG. 4 is a cross-sectional view taken along the B-B of the lighting device of FIG. 2.
Figure 5:
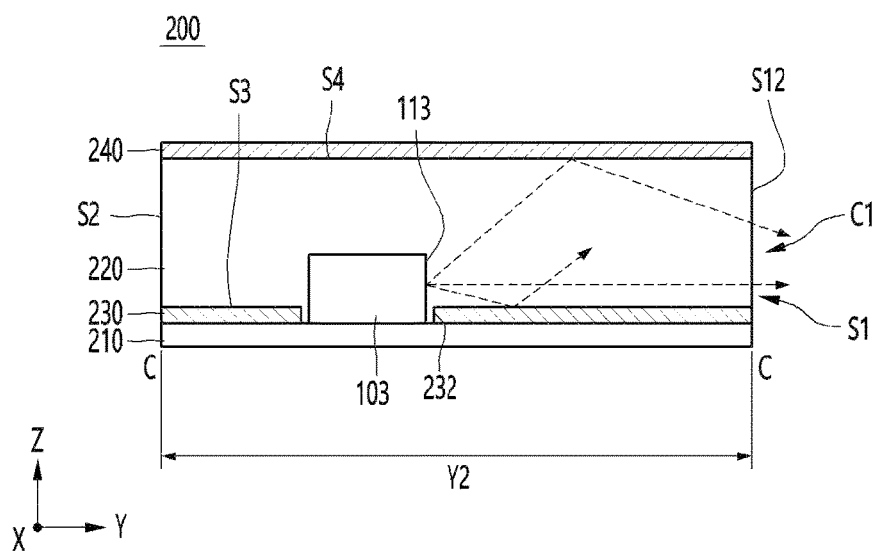
FIG. 5 is a cross-sectional view taken along the line C-C of the lighting device of FIG. 2.
Figure 6:
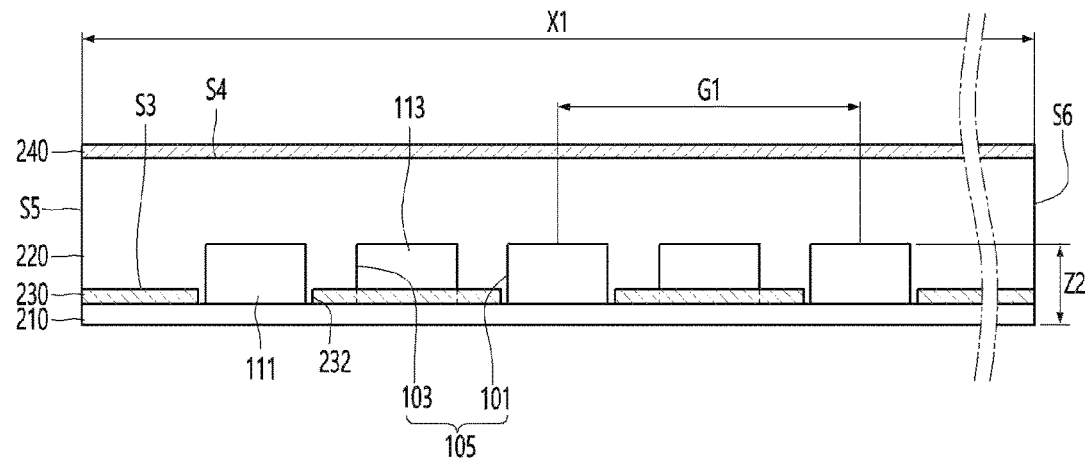
FIG. 6 is a cross-sectional view taken along the D-D of the lighting device of FIG. 2.
Figure 7:
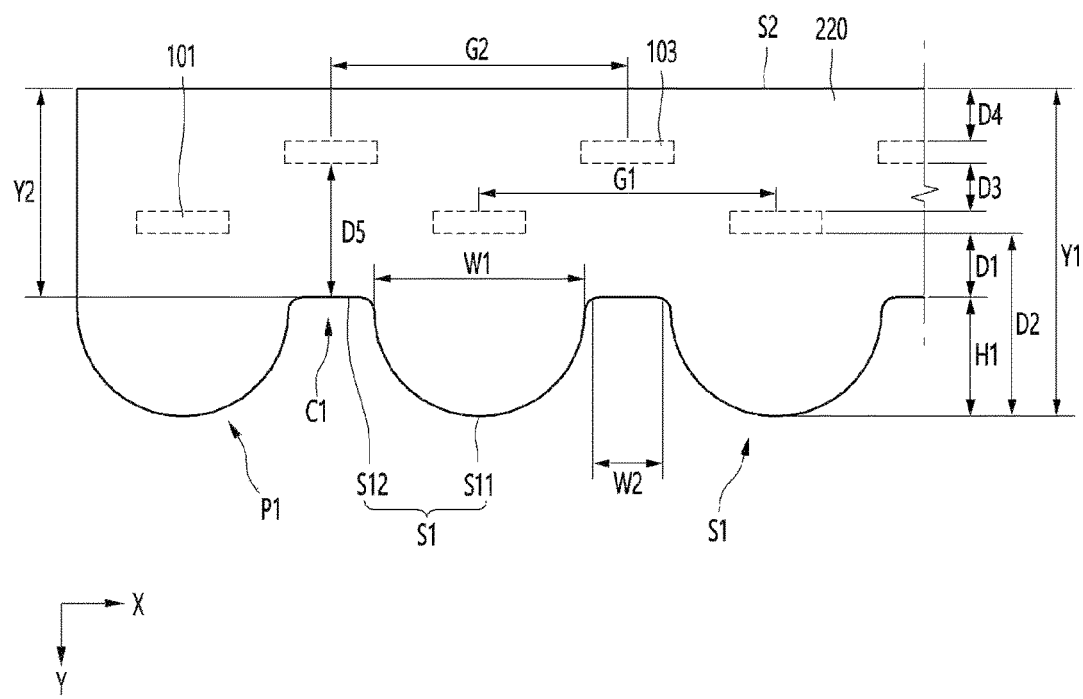
FIG. 7 is a view for explaining a relationship between light emitting devices and an exit surface in a resin layer of the lighting device of FIG. 2.
Figure 8:
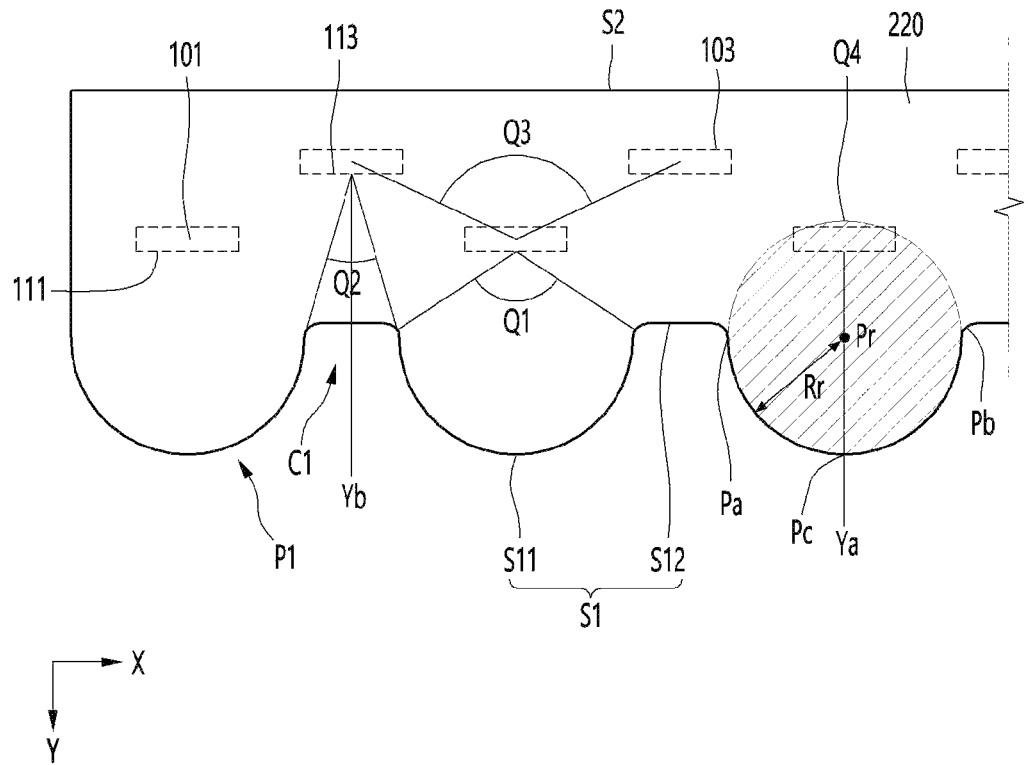
FIG. 8 is a view illustrating first and second exit surfaces facing the first and second light emitting devices in the resin layer of the lighting device of FIG. 2.

FIG. 1 is a perspective view showing a lighting device according to an embodiment of the invention, FIG. 2 is a plan view of the lighting device of FIG. 1, FIG. 3 is a front view of the lighting device of FIG. 1, FIG. 4 is a cross-sectional view taken along the B-B of the lighting device of FIG. 2, FIG. 5 is a cross-sectional view taken along the line C-C of the lighting device of FIG. 2, FIG. 6 is a cross-sectional view taken along the D-D of the lighting device of FIG. 2, FIG. 7 is a view for explaining a relationship between light emitting devices and an exit surface in a resin layer of the lighting device of FIG. 2, and FIG. 8 is a view illustrating first and second exit surfaces facing the first and second light emitting devices in the resin layer of the lighting device of FIG. 2.

Referring to FIGS. 1 to 8, the lighting device 200 according to an embodiment of the invention includes a plurality of light emitting devices 105, and the light emitted from the light emitting devices 105 may be emitted as a line-shaped surface light source. The plurality of light emitting devices 105 may be arranged in a plurality of rows. The plurality of rows may be two or more, and will be described as, for example, two rows. The light emitting device 105 may include a plurality of first light emitting devices 101 and a plurality of second light emitting devices 103. The plurality of first light emitting devices 101 may be disposed in a first row, and the plurality of second light emitting devices 103 may be disposed in a second row. The plurality of first light emitting devices 101 and the plurality of second light emitting devices 103 may be arranged in different rows. For example, each of the plurality of second light emitting devices 103 may be respectively disposed at a position moved in the first direction from a region between the plurality of first light emitting devices 101. The plurality of first light emitting devices 101 and the plurality of second light emitting devices 103 may not overlap in the second direction X. The first light emitting device 101 and the second light emitting device 103 may not overlap in the first direction Y. Here, the first direction Y may be a direction orthogonal to a direction in which the first light emitting devices 101 are arranged. The direction in which the first light emitting devices 101 are arranged may be the second direction X, or a direction orthogonal to the first direction Y and the third direction Z. Each of the first and second light emitting devices 101 and 103 may be defined as a light source.

An interval between the plurality of first light emitting devices 101 may be arranged at a first interval G1, and an interval between the plurality of second light emitting devices 103 may be arranged at a second interval G2. The first interval G1 may be the same as the second interval G2. The interval between the adjacent first and second light emitting devices 101 and 103 may be smaller than the first interval G1 and the second interval G2. A shape connecting the centers of the first and second light emitting devices 101 and 103 may be arranged in a zigzag shape. The first interval G1 and the second interval G2 may be greater than the thickness of the lighting device 200, for example, a vertical distance from the lower surface of the substrate 210 to the upper surface of the second reflective layer 240. For example, when the vertical distance is Z1, the intervals G1 and G2 may be three or more times the Z1. The first interval G1 and the second interval G2 may be 10 mm or more, for example, in a range of 10 mm to 20 mm. When the intervals G1 and G2 are larger than the above range, the luminous intensity may be decreased, and when smaller than the above range, the number of the light emitting devices 101 and 103 may be increased.

As shown in FIGS. 4 to 6, in the lighting device 200, the length X1(FIG. 6) in the row direction or the second direction X may be greater than the length Y1 in the column direction or the first direction Y. The lengths Y1 and X1 in the first and second directions Y and X may be greater than the thickness Z1 or the height of the lighting device 200 in the third vertical direction Z. The length X1 of the second direction X in the lighting device 200 may vary depending on the number of the light emitting devices 105 disposed therein, and may be, for example, 30 mm or more. The length Y1 in the first direction Y may vary depending on the number of rows of the light emitting devices 105, and may be, for example, 16 mm or more and may be smaller than the length X1 in the second direction X. The lighting device 200 may provide a region in which the light emitted from the light emitting device 105 is diffused and a region protecting the rear of the light emitting device 105. The lighting device 200 may be a flexible module or a rigid module. The lighting device 200 may be flat or flexible in at least one of the first and second directions Y and X. The lighting device 200 may be provided as a module having flexibility in the second direction X.

The light emitting device 105 may be disposed between the layers of the reflective material facing each other in the vertical direction, or may be disposed adjacent to any one layer in the region between the layers of a reflective material facing each other in the vertical direction. The light emitting device 105 may be disposed between a supporting member and a reflective member or layer that are vertically opposed to each other. The light emitting device 105 may emit light in at least one direction or may emit light in a plurality of directions. Each side of the lighting device 200 may have the same thickness or the same height as each other. The light emitting device 105 may be sealed by a layer of a transparent resin material, and the layer of the resin material may be disposed between layers of a reflective material or between a supporting member and a reflective layer or member.

The lighting device 200 may include a substrate 210, a resin layer 220 on the substrate 210, and a second reflective layer 240 on the resin layer 220. The lighting device 200 may include a first reflective layer 230 between the substrate 210 and the resin layer 220. The resin layer 220 may be disposed on the light emitting devices 105. The resin layer 220 may be disposed on each side of the light emitting device 105, between adjacent light emitting devices 105, or disposed on upper portion of each of the light emitting devices 105.

The substrate 210 includes a printed circuit board (PCB), for example, a resin-based printed circuit board (PCB), a metal core PCB, a flexible PCB, and a ceramic PCB., or a FR-4 substrate. The substrate 210 may be a flexible or non-flexible substrate. A circuit pattern may be disposed on the substrate 210. The circuit pattern of the substrate 210 may include a plurality of pads in a region corresponding to the light emitting device 105. The circuit pattern in the substrate 210 may be disposed on an upper portion, or may be disposed on an upper portion and a lower portion.

The resin layer 220 may be disposed on the substrate 220. The resin layer 220 may be disposed between the substrate 210 and the second reflective layer 240. The resin layer 220 may be disposed between the upper surface of the substrate 210 and the lower surface of the second reflective layer 240. The resin layer 220 may surround or embed the plurality of light emitting devices 105 disposed on the substrate 210. The resin layer 220 may be a light-transmitting layer. The resin layer 220 may include a glass material as another material. The n number of the plurality of first light emitting devices 101 may be disposed in a first row or along a first line. The m number of the plurality of second light emitting devices 103 may be disposed in a second row or second line. The above n≥m is satisfied, and n and m may be integers of 2 or more.

As shown in FIGS. 1 to 6, the resin layer 220 may include a first surface S1, a second surface S2 opposite to the first surface S1, a third surface S3 that is a lower surface, a fourth surface S4 that is an upper surface, an outer fifth surface S5 and an outer sixth surface S6. The first surface S1 may be an exit surface from which the light emitted from the light emitting device 105 is emitted. The first surface S1 may be a front surface or an exit surface, and the second surface S2 may be a rear surface or a non-exit surface. In the resin layer 220, the first surface S1 and the second surface S2 may be disposed opposite to each other with respect to the first direction Y, and the fifth surface S5 and the second surface S2 may be disposed on opposite sides of each other. The six surfaces S6 may be disposed opposite to each other with respect to the second direction X, and the third and fourth surfaces S3 and S4 are orthogonal to the vertical direction, that is, disposed opposite to each other with respect to the third direction Z. The first surface S1 is a surface from which light is emitted, and a vertical surface having a predetermined height may extend in the second direction X. As another example, the first surface S1 may be a curved surface convex with respect to a vertical direction, an inclined structure protruding from an upper end to a lower end, or an inclined structure protruding from the upper end to the lower end. The first and second surfaces S1 and S2 and the fifth and sixth surfaces S5 and S6 may be a part of each side of the lighting device 200, and may extend in a vertical direction from each side of the first and second reflective layers 230 and 240 or/and the substrate 210. In the resin layer 220, the lengths of the first and second surfaces S1 and S2 in the second direction X may be greater than the lengths of the fifth and sixth surfaces S5 and S6 in the first direction Y. The length of the first surface S1 in the second direction X may be the length of a straight line between one end of the fifth surface S5 and one end of the sixth surface S6. The length in the second direction X of the second surface S2 may be a length of a straight line between the other end of the fifth surface S5 and the other end of the sixth surface S6. A length in the first direction Y of the first surface S1 and the second surface S2 may be greater than a height or thickness in the vertical direction. The first surface S1 may be transparent or a surface through which light is emitted. At least one of the first surfaces S1 may face the emission portions 111 and 113 of the light emitting device 105. For example, the first surface S1 may face the emission portions 111 and 113 of the first and second light emitting devices 101 and 103. At least one side from which light is emitted among the side surfaces of the first light emitting device 101 is a first emission portion 111, and at least one side from which light is emitted among the side surfaces of the second light emitting device 103 is a second emission portion 113. The first surface S1 may be a surface from which light is emitted, and may be a surface on which a shape for regularly emitting light or a concave-convex structure is arranged. The first surface S1 may be a region having a larger surface area than that of the opposite second surface S2. The first surface S1 may include a first exit surface S11 facing the first light emitting device 101 and a second exit surface S12 facing the second light emitting device 103. The first exit surface S11 may face or face the first emission portion 111 of the first light emitting device 101. The second exit surface S12 may face or face the second emission portion 113 of the second light emitting device 103. The first and second exit surfaces S11 and S12 may be surfaces on which the resin layer 220 is exposed, or a surface on which light having a higher luminous intensity than other surfaces is emitted. The first and second exit surfaces S11 and S12 may be an outer side disposed between the plurality of reflective layers 230 and 240 or an outer side disposed between the substrate 210 and the second reflective layer 240.

The first exit surfaces S11 may be disposed in plurality, and the plurality of first exit surfaces S11 may be spaced apart from each other. The second exit surface S12 may be disposed in plurality, and may be respectively disposed between the first exit surfaces S11. The first and second exit surfaces S11 and S12 may be alternately disposed. An exit surface disposed at the outermost side on the first surface S1 in the first direction Y may be the first exit surface S11. The outermost first exit surface S11 may extend from the fifth surface S5 or may extend from the sixth surface S6. A center of each of the plurality of first exit surfaces S11 may be disposed at a position corresponding to a center of each of the plurality of first light emitting devices 101. A center of each of the plurality of second exit surfaces S12 may be disposed at a position corresponding to a center of each of the plurality of second light emitting devices 103. Each of the plurality of first light emitting devices 101 may not overlap each of the plurality of second light emitting devices 103 in the first direction Y. The first exit surface S11 and the second exit surface S12 may not overlap in the first direction Y.

The resin layer 220 may cover or mold the first and second light emitting devices 101 and 103. The first and second light emitting devices 101 and 103 may include light emitting chips. The first and second light emitting devices 101 and 103 may include reflective sidewalls surrounding the outside of the light emitting chip. The reflective sidewall may have a structure in which a region facing the first surface S1 of the resin layer 220 is open and surrounds the periphery of the light emitting chip. The reflective sidewall may be a part of the first and second light emitting devices 101 and 103 or may be separately provided with a reflective material. Sides of the first and second light emitting devices 101 and 103 except for the emission portions 111 and 113 may be formed of a reflective material or a transparent or opaque material.

The first and second light emitting devices 101 and 103 may have a bonding portion disposed thereunder and may be electrically connected to the pad of the substrate 210. The first and second light emitting devices 101 and 103 may be connected in series by a circuit pattern of the substrate 210 or may be in series-parallel, parallel-series or parallel. As another example, the first and second light emitting devices 101 and 103 may be connected in various groups by a circuit pattern of the substrate 210. The first and second light emitting devices 101 and 103 may include a device including a light emitting chip or a package in which an LED chip is packaged. The light emitting chip may emit at least one of blue, red, green, and ultraviolet (UV) light. The first and second light emitting devices 101 and 103 may emit at least one of white, blue, red, and green. The first and second light emitting devices 101 and 103 may emit light in a lateral direction, and a bottom portion may be disposed on the substrate 210. The first and second light emitting devices 101 and 103 may be a side view type package. As another example, the first and second light emitting devices 101 and 103 may be LED chips, and one surface of the LED chip may be opened and a reflective member may be disposed on the other surface.

As shown in FIG. 6, the height Z2 from the lower surface of the substrate 210 to the upper surface of the light emitting device 105 may be 2.5 mm or less, for example, 2 mm or less, or 1.5 mm to 2 mm. By providing such a small height Z2, the height of the line light source may be reduced.

Figure 9:
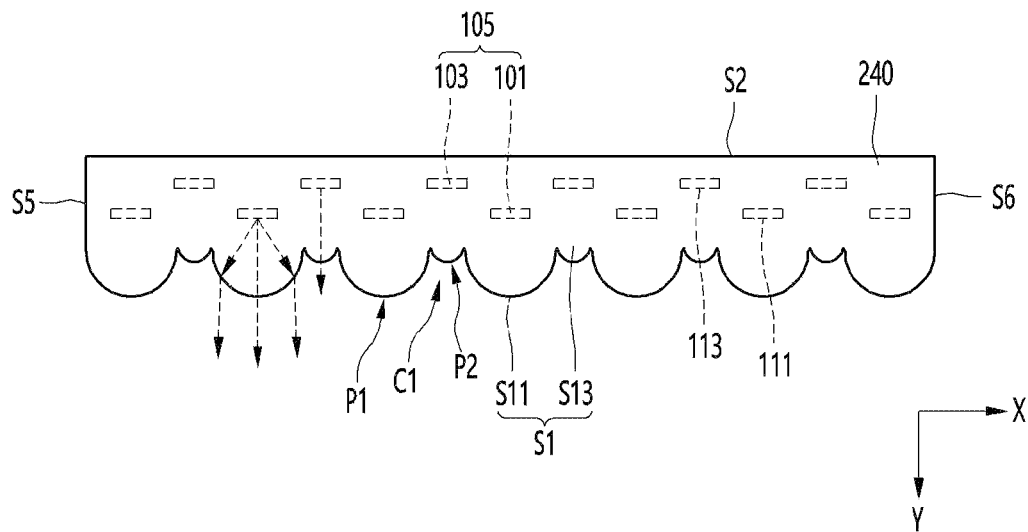
FIG. 9 is a plan view illustrating a first modified example of a lighting device according to an embodiment of the invention.

The resin layer 220 may include a first convex portion P1 that has a first exit surface S11 and protrudes from the first surface S1. The first convex portion P1 may have a convex first exit surface S11 or a first convex surface disposed in the direction of the first surface S1. In the resin layer 220, a second exit surface S12 may be disposed in a region between the first convex portions P1 on the first surface S1. The second exit surface S12 may be a flat surface or may include a protruding second convex portion P2 or a second convex surface as shown in FIG. 9. The resin layer 220 or the lighting device 200 may include a recessed portion C1 recessed in the direction of the second surface S2 in a region between the first convex portions P1. The recessed portion C1 may overlap a region of the second exit surface S12 in the second direction X. The recessed portions C1 may be disposed between the first convex portions P1, respectively. The recessed portion C1 may be spaced apart from the fifth and sixth surfaces S5 and S6.

As shown in FIGS. 3 to 6, the resin layer 220 may be disposed on the substrate 210. The first reflective layer 230 may be disposed between the resin layer 220 and the substrate 210. The resin layer 220 may be in contact with upper surfaces and side surfaces of the first and second light emitting devices 101 and 103. The resin layer 220 may be in contact with an upper surface of the first reflective layer 230. A portion of the resin layer 220 may be in contact with the substrate 210 through a hole in the first reflective layer 230. The resin layer 220 may be in contact with the emission portions 111 and 113 of the first and second light emitting devices 101 and 103. The first surface S1, the second surface S2, the fifth surface S5, and the sixth surface S6 of the resin layer 220 are outer surfaces between the first and second reflective layers 230 and 240. The first surface S1, the second surface S2, the fifth surface S5, and the sixth surface S6 may be peripheral sides of the light emitting device 105 or corresponding sides to the side surfaces of the light emitting device 105. The fourth surface S4 of the resin layer 220 may contact the second reflective layer 240, and the third surface S3 may contact the first reflective layer 230. The third surface S3 and the fourth surface S4 may be horizontal to each other. In the absence of the first reflective layer 230, the third surface S3 may be in contact with the substrate 210. When the lighting device is flat, the third and fourth surfaces S3 and S4 may include a flat surface.

Referring to FIGS. 3 to 6, an area of the third surface S3 of the resin layer 220 may be the same as an area of the upper surface of the substrate 210. The area of the third surface S3 of the resin layer 220 may be the same as the area of the upper surface of the first reflective layer 230. The area of the third surface S3 of the resin layer 220 may be the same as the area of the upper surface of the second reflective layer 240. A length of the resin layer 220 in the second direction X may be the same as a length (e.g., X1) of the substrate 210. The maximum length of the resin layer 220 in the second direction X may be the same as the maximum length of the first reflective layer 230 or the second reflective layer 240. The maximum length (e.g., Y1) of the resin layer 220 in the first direction Y may be the same as a maximum length of the substrate 210. The maximum length (e.g., Y1) of the resin layer 220 in the first direction Y may be the same as a maximum length of the first reflective layer 230. The maximum length (e.g., Y1) of the resin layer 220 in the first direction Y may be the same as a maximum length of the second reflective layer 240. The minimum length (e.g., Y2) of the resin layer 220 in the first direction Y may be the same as a minimum length of the substrate 210. The minimum length (e.g., Y2) of the resin layer 220 in the first direction Y may be the same as a minimum length of the first reflective layer 230 or the second reflective layer 240. The maximum length Y1 in the first direction Y may be a length between the apex (or the outermost point) of the first convex portion P1 of the lighting device and the second surface S2, and the minimum length Y2 may be a length between a point of the second exit surface S12 of the lighting device and the second surface S2. The resin layer 220 may be disposed between the first and second reflective layers 230 and 240. The first and second reflective layers 230 and 240 may have the same area and may face each other on the third surface S3 and the fourth surface S4 of the resin layer 220. Accordingly, the resin layer 220 may diffuse the light emitted from the light emitting device 105 and the light reflected by the first and second reflective layers 230 and 240 to guide and emit the light in the direction of the first surface S1.

As shown in FIG. 4, the resin layer 220 may be formed to have a thickness Zb greater than that of the light emitting device 105. A portion of the resin layer 220 may be disposed between the first and second light emitting devices 101 and 103 and the second reflective layer 240. Accordingly, the resin layer 220 may protect the upper portions of the first and second light emitting devices 101 and 103 and prevent moisture penetration. Since the substrate 210 is disposed on the lower portion of the light emitting device 105 and the resin layer 220 is disposed on the upper portion of the light emitting device 105, the light emitting device 105 may be protected. Accordingly, the interval between the fourth surface S4 of the resin layer 220 and the upper surface of the light emitting device 105 may be 0.6 mm or less, for example, in a range of 0.5 mm to 0.6 mm. An upper portion of the resin layer 220 may extend to an upper portion of the light emitting device 105 to protect the upper portion of the light emitting device 105.

The thickness Zb of the resin layer 220 may be an interval between the third surface S3 and the fourth surface S4 of the resin layer 220. The thickness Zb of the resin layer 220 may be a vertical distance between the first and second reflective layers 230 and 240. The thickness Zb may be equal to a distance between the first and second reflective layers 230 and 240. The thickness Zb may be smaller than a distance between the first surface S1 and the second surface S2. For example, the distance between the first surface S1 and the second surface S2 may include the maximum length Y1 or the minimum length Y2. The maximum length Y2 in the first direction Y may be a linear distance between the high point of the first convex portion P1 and the second surface S2. A distance or an interval between the fifth and sixth surfaces S5 and S6 of the resin layer 220 may be greater than a distance between the apex of the first convex portion P1 and the second surface S2. The minimum length Y2 in the first direction Y may be a linear distance between the second exit surface S12 and the second surface S2. The distance or interval between the first reflective layer 230 and the second reflective layer 240 may be smaller than the distance or interval between the first surface S1 and the second surface S2 of the resin layer 220. By arranging the distance between the first and second reflective layers 230 and 240 to be smaller than the length or minimum width in the first direction Y of the lighting device 200, a line-shaped surface light source may be provided, the luminous intensity may be improved and hot spots may be prevented. In addition, the lighting device may be provided with a flexible characteristic that may be convex or concave in the third direction Z. The thickness Zb of the resin layer 220 may be less than twice the thickness of the light emitting device 105, for example, more than 1 to 2 times or less than the thickness of the light emitting device 105. The thickness Zb of the resin layer 220 may be 2 mm or less, for example, in the range of 1.5 mm to 1.9 mm or in the range of 1.6 mm to 1.8 mm. The thickness Zb of the resin layer 220 may be 0.8 times or less of the thickness Z1 of the lighting device 200, for example, in a range of 0.4 times to 0.8 times the thickness Z1 of the lighting device 200. Since the resin layer 220 is disposed with a difference of 1.2 mm or less from the thickness Z1 of the lighting device 200, it is possible to prevent a decrease in light efficiency in the lighting device 200 and to strengthen the ductility characteristics. A thickness Zb of the resin layer 220 may be smaller than a length or a maximum length in the second direction X of the second light emitting device 103. The thickness Zb of the resin layer 220 may be smaller than the maximum length W1 of the first exit surface S11 in the second direction X. The thickness Zb of the resin layer 220 may be equal to or smaller than the maximum length of the second exit surface S12 in the second direction X. That is, by providing the thickness Zb of the slim resin layer 220, a line-shaped surface light source may be provided through the first surface S1 in one direction.

The resin layer 220 may include a resin material such as silicone, silicone molding compound (SMC), epoxy, or epoxy molding compound (EMC). The resin layer 220 may include a UV (ultraviolet) curable resin or a thermosetting resin material, for example, may selectively include PC, OPS, PMMA, PVC, and the like. For example, as a main material of the resin layer 420, a resin material containing urethane acrylate oligomer as a main material may be used. For example, the main material may be used a mixture of a synthetic oligomer, urethane acrylate oligomer, and a polyacrylic polymer type. Of course, it may further include a monomer in which a low-boiling-point dilution-type reactive monomer such as 1130A (isobornyl acrylate), HPA (Hydroxylpropyl acrylate), 2-HEA (2-hydroxyethyl acrylate), etc.) may be further included, and as an additive, a photoinitiator (for example, 1-hydroxycyclohexyl phenylketone, Diphenyl) or an antioxidant or the like may be mixed.

A bead (not shown) may be included in the resin layer 220, and the bead may diffuse and reflect incident light, thereby increasing the amount of light. The resin layer 220 may include a phosphor. The phosphor may include at least one of a yellow phosphor, a green phosphor, a blue phosphor, and a red phosphor.

A region in the resin layer 220 in which the first convex portion P1 is formed may serve as a lens portion. The lens portion of the resin layer 220 is provided in a lens shape having a first convex surface, and may include a hemispherical shape, a semicircular shape, a semi-elliptical shape, or an aspherical shape when viewed from a top view. The lens may include a collimator lens. The lens portion may be further spaced apart from the first light emitting device 101 by an apex corresponding to the center of the light emitting device 105. The thickness of the lens portion in the third direction Z may be the thickness of the resin layer 220. Since the lens portion has flat upper and lower surfaces and a curved surface in a direction of the first surface S1, it is possible to diffuse light incident in a direction of the first surface S1. The lens portion may be disposed between the first and second flat reflective layers 230 and 240 on the upper and lower portions, and may refract light to the first surface S1 and emit the light. The lens portion may refract light incident to a region deviating from the optical axis with respect to the optical axis at an exit angle greater than an incidence angle. When the lighting device 200 has a curve due to its ductility, the resin layer 220 and the first and second reflective layers 230 and 240 may include curved regions instead of being flat. Each of the first exit surfaces S11 of the resin layer 220 may emit light emitted from each of the first light emitting devices 101. Each of the second exit surfaces S12 disposed between the first exit surfaces S11 of the resin layer 220 may emit light emitted from each of the second light emitting devices 103. That is, a dark portion may be existed in a region between the second exit surface S12 and the second light emitting device 103 and the first exit surface S11, and a difference between a luminous intensity of the light emitted through the first exit surface S11 and a luminous intensity of the light emitted through the second exit surface S12 may be reduced. Accordingly, it is possible to reduce or eliminate the occurrence of dark portions on the second exit surface S12.

The recess portion C1 disposed between the first convex portions P1 in the resin layer 220 may be provided as a recess recessed in the direction of the second surface S2. The recessed portion C1 of the resin layer 220 may be formed on the second exit surface S12 of the resin layer 220. Since the light emitted from the second light emitting device 103 is emitted from the region between the first convex portions P1 through the recess portion C1, it is possible to reduce the occurrence of dark portions in the recess portion C1. Here, when the first convex portion P1 and the recessed portion C1 are disposed on the resin layer 220, a shape of the one side direction of the substrate 210 and the first and second reflective layers 230 and 240 may be provided in a shape corresponding to the first convex portion P1 and the recessed portion C1. The number of the first convex portions P1 or the lens portions of the resin layer 220 may be the same as the number of the first light emitting devices 101. The number of the recesses C1 may be the same as the number of the second light emitting devices 103.

The first reflective layer 230 may reflect the light emitted from the light emitting device 105. The first reflective layer 230 may be formed on the upper surface of the substrate 210. The first reflective layer 230 may be formed as an upper layer of the substrate 210 or as a separate layer. The first reflective layer 230 may be adhered to the upper surface of the substrate 210 with an adhesive. The resin layer 220 may be adhered to the upper surface of the first reflective layer 230. The first reflective layer 230 has a plurality of holes 232 in a region corresponding to the lower surface of the light emitting device 105, and the light emitting device 105 may be connected to the substrate 210 through the holes 232. A portion of the resin layer 220 may be in contact with the substrate 210 through the hole 232. The hole 232 may be a region in which the light emitting device 105 is bonded to the substrate 210. The first reflective layer 230 may have a single-layer or multi-layer structure. The first reflective layer 230 may include a material that reflects light, for example, a metal or a non-metal material. When the first reflective layer 230 is a metal, it may include a metal layer such as stainless steel, aluminum (Al), or silver (Ag), and in the case of a non-metallic material, it may include a white resin material or a plastic material. The first reflective layer 230 may include a white resin material or a polyester (PET) material. The first reflection layer 230 may include at least one of a low reflection film, a high reflection film, a diffuse reflection film, and a regular reflection film. The first reflective layer 230 may be provided, for example, as a specular reflective film for reflecting incident light to the first surface S1.

As shown in FIG. 4, the thickness Zc of the first reflective layer 230 may be smaller than the thickness Za of the substrate 210. The thickness Zc of the first reflective layer 230 may be 0.5 times or more and less than 1 times the thickness Za of the substrate 210 to reduce transmission loss of incident light. The thickness Zc of the first reflective layer 230 may be in the range of 0.2 mm to 0.4 mm, and when it is smaller than the above range, light transmission loss may occur, and when it is thicker than the above range, the thickness Zc of the lighting device 200 Z1 may increase. The second reflective layer 240 may be disposed on the entire region of the fourth surface S4 of the resin layer 220 to reduce light loss.

The second reflective layer 240 may be made of the same material as the first reflective layer 230. In order to reflect light and reduce transmission loss of light, the second reflective layer 240 may be made of a material having a higher light reflectance than that of the first reflective layer 230 or may have a thicker thickness. The second reflective layer 240 may have a thickness equal to or greater than the thickness Zc of the first reflective layer 230. For example, the first and second reflective layers 230 and 240 may be provided with the same material and the same thickness. The thickness Zd of the second reflective layer 240 may be equal to or smaller than the thickness Za of the substrate 210. The thickness Zd of the second reflective layer 240 is at least 0.5 times the thickness Za of the substrate 210, for example, in the range of 0.5 times to 1 time to reduce transmission loss of incident light. The thickness Zd of the second reflective layer 240 may be in the range of 0.2 mm to 0.4 mm, and when it is smaller than the above range, light transmission loss may occur, and when it is thicker than the above range, the thickness of the lighting device 200 Z1 may increase.

The second reflective layer 240 may be formed in a single-layer or multi-layer structure. The second reflective layer 240 may include a material that reflects light, for example, a metal or a non-metal material. When the second reflective layer 240 is a metal, it may include a metal layer such as stainless steel, aluminum (Al), or silver (Ag), and in the case of a non-metallic material, it may include a white resin material or a plastic material. The second reflective layer 240 may include a white resin material or a polyester (PET) material. The second reflection layer 240 may include at least one of a low reflection film, a high reflection film, a diffuse reflection film, and a regular reflection film. The second reflective layer 240 may be provided as a specular reflective film so that, for example, incident light travels in the direction of the first surface S1. The first and second reflective layers 230 and 240 may be made of the same material or different materials.

The laminated structure of the substrate 210, the first reflective layer 230, the resin layer 220, and the second reflective layer 240 may have a structure of the first convex portion P1 and the recessed portion C1 in one direction. The first convex portion P1 may have a flat upper surface and a flat lower surface, and may include a curved surface or a hemispherical shape in the first direction Y. The recess portion C1 may include a flat or convex curved surface in the direction of the second surface S2. At least one or both of the first and second exit surfaces S11 and S12 of the resin layer 220 may be treated as a haze surface, thereby diffusing light. The haze surface may be treated as a surface rougher than the inner surface of the resin layer 220 to diffuse the emitted light.

Figure 22:
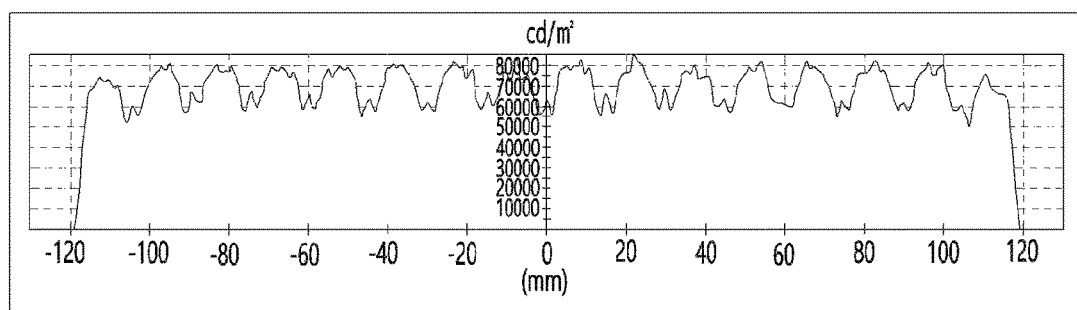
FIG. 22 is a diagram illustrating a light distribution of the lighting device of FIG. 1.

As shown in FIGS. 1 and 22, the luminance distribution of the light emitted through the second exit surface S12 of the resin layer 220 in the lighting device 200 may be irradiated to 70% or more, for example, 75% or more based on the luminance distribution of the light emitted through the first exit surface S11. Accordingly, the difference between the luminance distribution of the light emitted to the first exit surface S11 and the luminance distribution of the light emitted through the second exit surface S12 may be 30% or less, and thus the dark portion may not be recognized on the external image. The uniformity of the total light of such a lighting device may be improved to 80% or more.

Meanwhile, the plurality of first light emitting devices 101 may be arranged in a direction from the fifth surface S5 to the sixth surface S6 of the resin layer 220. The plurality of second light emitting devices 103 may be arranged in a direction from the fifth surface S5 to the sixth surface S6 of the resin layer 220. In a region between the first and second surfaces S1 and S2, the first and second light emitting devices 101 and 103 may be arranged in different rows. The first light emitting device 101 may be disposed closer to the first surface S1 than the second light emitting device 103. The second light emitting device 103 may be disposed closer to the second surface S2 than the first light emitting device 101.

The first surface S1 and the second surface S2 may have the same height or thickness in a vertical direction. As another example, the height or thickness of the first surface S1 and the second surface S2 may be different from each other, for example, the thickness of the first surface S1 may be greater than the thickness of the second surface S2. Each of the surfaces S1, S2, S5, and S6 of the lighting device 200 may be each side of the resin layer 220 having the thickest thickness in the lighting device 200.

The first or second light emitting devices 101 and 103 may be arranged on a straight line extending in the second direction X. The first or second light emitting devices 101 and 103 may be arranged on a virtual curve having a curvature or an inclined oblique line with respect to the second direction X.

The plurality of light emitting devices 105 (101, 103) may face the first surface S1. The emission portions 111 and 113 of the plurality of light emitting devices 105 (101, 103) may face the first surface S1. The light emitted from the light emitting device 105 is emitted through the first surface S1, and some light may be emitted through at least one of the second surface S2, the fifth surface S5, and the sixth surface S6. That is, most of the light emitted from the light emitting device 105 may be emitted through the first surface S1.

The first exit surface S11 may protrude more than a straight line connecting one end of the third and fourth surfaces S3 and S4. The convex shape of the first exit surface S11 may be a hemispherical shape, a shape having a curved surface, a semicircle, a semi-elliptical shape, or an aspherical shape. The first exit surface S11 may protrude from the first light emitting device 101 in the first direction Y or in a direction of the first surface S1, and a protruding shape is a first protrusion portion P1 and have a hemispherical, curved or non-spherical shape. The second exit surface S12 may be disposed between the first exit surfaces S11, respectively. Each of the second exit surfaces S12 may be connected between lower ends of the adjacent first exit surfaces S11. The second exit surface S12 may extend horizontally or flatly between lower ends of the adjacent first exit surfaces S11. A boundary portion between the first and second exit surfaces S11 and S12 may be an angled surface, a curved surface, or a rounded surface. A thickness in a vertical direction of the first exit surface S11 may be the same as a thickness in a vertical direction of the second exit surface S12.

Referring to FIGS. 7 and 8, the first exit surface S11 may include first and second points Pa and Pb closest to the first light emitting device 101, and a third point Pc having a maximum distance from the first light emitting device 101, wherein the first and second points Pa and Pb may be both ends of the first exit surface S11, and the third point Pc may be a center point of the first exit surface S11. The maximum length W1 between the first and second points Pa and Pb may be the maximum length of the first exit surface S11 in the second direction X or the maximum length of the first convex portion P1. The first exit surface S11 may be provided as a convex curved surface from the first and second points Pa and Pb toward the third point Pc. The first and second points Pa and Pb may be disposed at symmetrical positions with respect to the third point Pc or may be spaced apart from each other by the same distance.

The second exit surface S12 may include both points disposed at both ends, and the both points may be a boundary point between the first and second points Pa and Pb or a portion recessed toward the second light emitting device 103. The length W2 in the second direction X of the second exit surface S12 is the maximum length, and may be smaller than the maximum length W1 of the first exit surface S11. The length W2 may be 0.5 times or less, for example, in a range of 0.1 times to 0.5 times the length W1. When the length W2 is greater than the above range, there may be a problem in that the light emitted through the first exit surface S11, which is the main light, is affected or the length W1 of the first exit surface S11 is reduced, when it is smaller than the above range, the amount of light may be reduced, and thus the improvement of the dark portion may be insignificant.

The first exit surface S11 may overlap each of the first light emitting devices 101 in the first direction Y. The second exit surface S12 may overlap each of the second light emitting devices 103 in the first direction Y. The outer end of the second light emitting device 103, that is, both ends in the second direction X may overlap the first exit surface S11 in the first direction Y. That is, the maximum length W1 of the first exit surface S11 in the second direction X may be greater than the maximum length of the first light emitting device 101. The maximum length W2 of the second exit surface S12 in the second direction X may be equal to or greater than the maximum length of the second light emitting device 103. The length W2 may be 6 mm or less, for example, in the range of 1 mm to 6 mm. That is, since the maximum length W2 in the second direction X of the second exit surface S12 is provided to be relatively smaller than the maximum length W1 in the second direction X of the first exit surface S11, the luminous intensity of the light emitted through the second exit surface S12 may be improved without affecting the luminous intensity of the first exit surface S11.

As shown in FIG. 7, the maximum distance D2 between the first light emitting device 101 and the first surface S1 and the distance D4 between the second light emitting device 103 and the second surface S2 may be different from each other. The distance D4 between the second light emitting device 103 and the second surface S2 may be 2 mm or more, for example, may be in the range of 2 mm to 20 mm. When the distance D4 between the second light emitting device 103 and the second surface S2 is smaller than the above range, the region where moisture may penetrate or form a circuit pattern may be reduced, when it is larger the above range, the size of the device 200 may be increased. The maximum distance D2 is the maximum distance between the first light emitting device 101 and the first exit surface S11, and may be 5 mm or more, for example, in a range of 5 mm to 20 mm or 8 mm to 20 mm. When the maximum distance D2 is smaller than the above range, a hot spot may be generated, and when it is larger than the above range, the module size may be increased.

The maximum distance D2 may be a maximum distance between the first light emitting device 101 and the first exit surface S11 or a linear distance between the apex of the first convex portion P1. The linear distance D5 between the second light emitting device 103 and the second exit surface S13 may be 5 mm or more, for example, in the range of 5 mm to 20 mm or in the range of 8 mm to 20 mm. When the linear distance D5 is smaller than the above range, a hot spot may be generated. The maximum distance D2 may be equal to or greater than the distance D5. The distance D3 between the straight line connecting the at least two first light emitting devices 101 and the straight line connecting the at least two second light emitting devices 103 may be provided with a size in which a circuit pattern can be formed, and may be provided in a range of 0.5 mm or more, for example, in a range of 0.5 mm to 4 mm. The distance D1 between the straight line connecting the second exit surfaces S13 and the first light emitting device 101 may be 5 mm or more, for example, in a range of 5 mm to 12 mm, and when the distance D1 is smaller than the above range, a depth H1 of the recess portion C1 may be increased or the maximum distance D2 between the first light emitting device 101 and the first convex portion P1 may be narrowed. Thus, a dark portion may be generated in the recess portion C1. The distance D1 may vary depending on the angle of beam spread of the first light emitting device 101. That is, when the distance between the straight line connecting both ends of the first convex portion P1 and the first light emitting device 101 is too close, the light may be condensed to the center region of the first exit surface S11, when it is too far away, light may be irradiated to the second exit surface S12, so that the luminous intensity through the first exit surface S11 may be reduced.

Here, when the first convex portion P1 has a lens shape, a relationship of $(n-1) \times (1-R)=1/f$ is satisfied, $R=(n-1)f$, and R may be proportional to f (D2 or D5). The R may be a radius of curvature Rf of the first convex portion P1, the f may be a focal length, and the n may be a refractive index. The refractive index is a refractive index of a material of the resin layer, and may be 1.6 or less, for example, in a range of 1.4 to 1.6. Here, the angle of beam spread is an angle of beam spread of the first light emitting device 101, and may be in the range of 115 degrees or more, for example, in a range of 115 degrees to 135 degrees. The radius of curvature Rr of the first convex portion P1 may be formed in consideration of the distribution of the angle of beam spread of the first light emitting device 101. Here, when the interval between the first convex portions P1 is the same, the interval between the first light emitting devices 101 may be the same. Here, a portion of the first light emitting device 101 may be disposed in the first virtual circle Q4 passing through the first convex portion P1. The first virtual circle Q4 may have a diameter equal to or greater than the maximum length W1 of the first convex portion P1 or the first exit surface S11. The virtual first circle Q4 may pass through at least two of the points Pa, Pb, and Pc of the first convex portion P1 or the first exit surface S11 based on the center Pr of the circle, and may be a circle having a radius Rr. The first emission portion 111 of the first light emitting device 101 may be disposed within a region of the first virtual circle Q4. The diameter of the first virtual circle Q4 may be greater than the maximum length D2. The diameter of the first virtual circle Q4 forming the first convex portion P1 may be equal to or greater than the maximum length W1 of the first exit surface S11 in the second direction X or the first convex portion P1.

Referring to FIG. 8, an angle Q1 formed by both points Pa and Pb of the first exit surface S11 with respect to the center of the first emission portion 111 of the first light emitting device 101 may be 115 degrees or more, for example, in the range of 115 to 135 degrees, and may be provided in consideration of the angle of beam spread. The angle Q2 formed by both ends of the second exit surface S12 with respect to the center of the second emission portion 113 of the second light emitting device 103 may be 30 degrees or less, for example, in the range of 2 degrees to 30 degrees. Accordingly, the light emitted through the second light emitting device 103 may be condensed through the second exit surface 103 and may be effectively emitted. As shown in FIG. 22, a difference between the luminous intensity emitted to the first exit surface S11 and the luminous intensity emitted to the second exit surface S12 may be 30% or less, for example, in the range of 5% to 30%. The angle Q3 between the straight lines passing the center of the adjacent second light emitting devices 103 from the first light emitting device 101 as a starting point may be 90 degrees or more, for example, in a range of 90 degrees to 150 degrees. The first central axis Ya passing through the center of the first convex portion P1 or the center of the virtual circle Q4 and the center of the first light emitting device 101 may be parallel to or may converge toward an randomly focal point with respect to the second central axis Yb passing through the center of the second exit surface 113 and the center of the second light emitting device 103.

Figure 10:
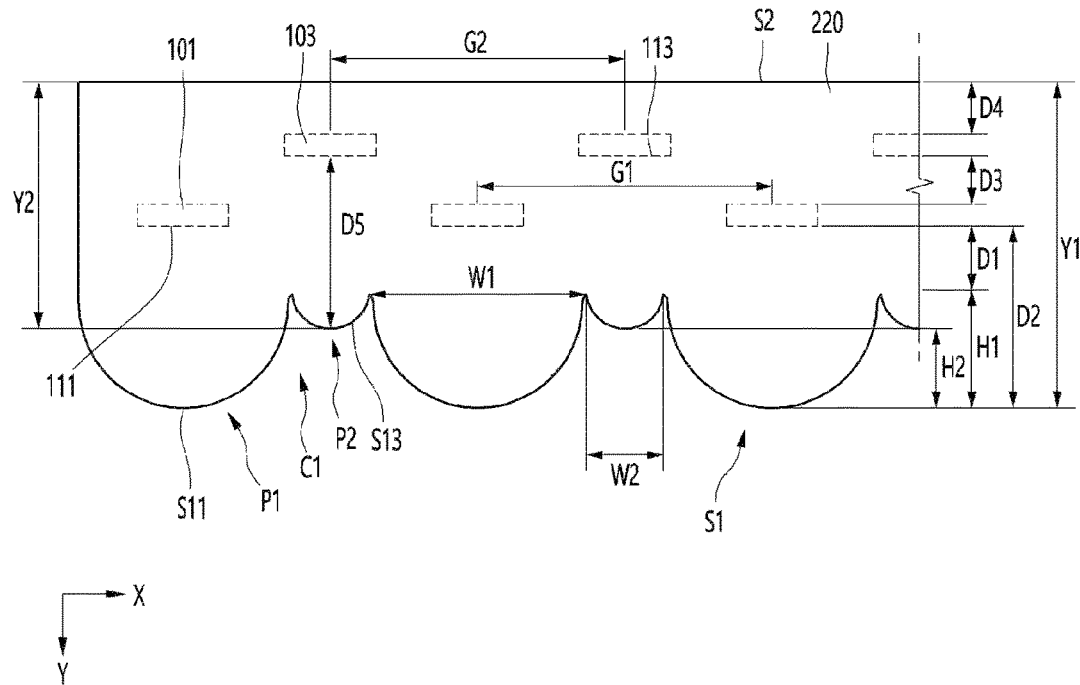
FIG. 10 is an enlarged view of the lighting device of FIG. 9.
Figure 11:
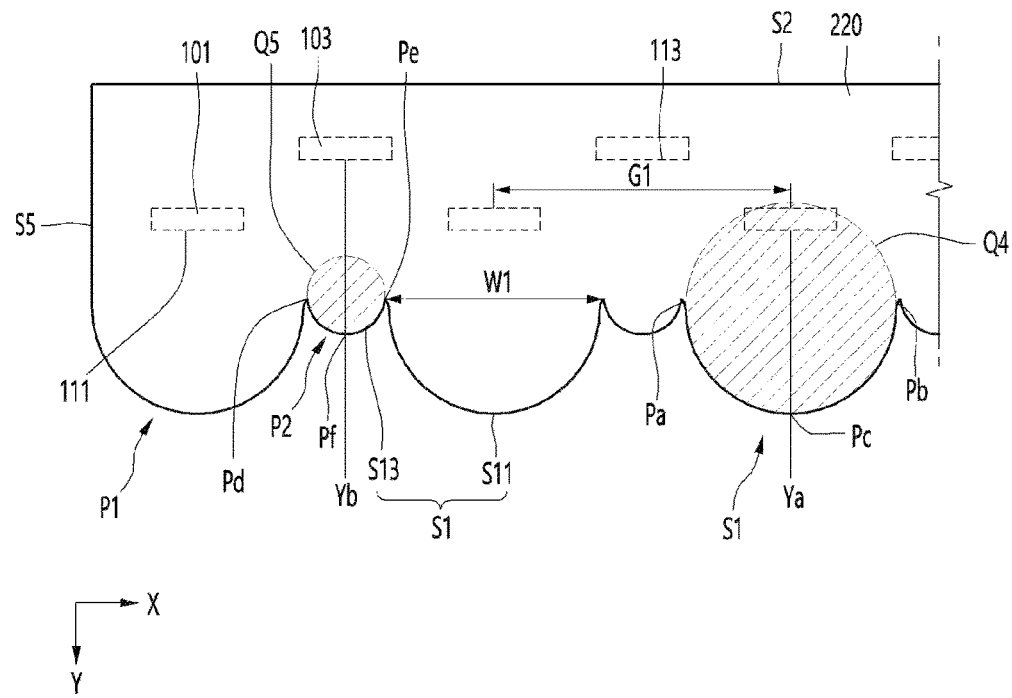
FIG. 11 is a view for explaining first and second exit surfaces in a resin layer of the lighting device of FIG. 9.

FIGS. 9 to 11 are modified examples of a lighting device according to an embodiment of the invention. The modified example may selectively include the configuration, description, or drawings of the embodiments disclosed above, and detailed descriptions thereof will be omitted.

In the description of the lighting device of FIGS. 9 to 11, as shown in FIGS. 3 to 6, the lighting device includes a substrate 210, a resin layer 220 and a second reflective layer 240, and first and second light emitting devices 101 and 103. In the lighting device, a first reflective layer 230 may be disposed between the substrate 210 and the resin layer 220. The detailed configuration of the substrate 210, the resin layer 220, the first and second reflective layers 230 and 240, and the first and second light emitting devices 101 and 103 may be selectively included with reference to the description of the embodiments disclosed above.

As shown in FIGS. 9 and 10, the first surface S1 of the resin layer 220 may include a first exit surface S11 and a second exit surface S13. The first exit surface S11 may include a first convex portion P1 protruding from the second exit surface S13 toward the first surface S1. The second exit surface S13 may protrude from both ends of the first exit surface S11 in the direction of the first surface. The first exit surface S11 may include a first convex portion P1. The second exit surface S13 may include a second convex portion P2. The first exit surface S1 may include a first convex surface, and the second exit surface S13 may include a second convex surface. The first exit surface S11, the first convex portion P1, or the first convex surface may be disposed at a position facing to the first light emitting device 101. The second exit surface S13, the second convex portion P2, or the second convex surface may be disposed at a position facing to the second light emitting device 103. Each of the plurality of first light emitting devices 101 may overlap the first exit surface S11, the first convex portion P1, or the first convex surface in the first direction Y. Each of the plurality of second light emitting devices 103 may overlap the second exit surface S13, the second convex portion P2, or the second convex surface in the first direction Y. The first convex portion P1 may have a first curvature, and the second convex portion P2 may have a second curvature, and the size of the second curvature may be different from the size of the first curvature, for example, and may be larger than the size of the first curvature. That is, the second radius of curvature of a circle having the second curvature may be smaller than the first radius of curvature of a circle having the first curvature. That is, the value of the curvature is the reciprocal of the radius of the curvature.

The maximum length Y1 from the second surface S2 of the resin layer 220 to the first convex portion P1 or the first exit surface S11 may be greater than the minimum length Y2 from the second surface S2 to the second convex portion P2 or the second exit surface S13. The maximum distance D5 from the second convex portion P2 or the second exit surface S13 to the second light emitting device 103 may be the same as the maximum distance D2 from the first convex portion P1 or the first exit surface S11 to the first light emitting device 101, or may have a difference of ±5% based on the distance D2. The maximum distance D5 may vary according to the second curvature of the second convex portion P2.

The apex of the second convex portion P2 may be formed to have a depth H2 smaller than the height H1 of the first convex portion P1 from the apex of the first convex portion P1. For example, the depth H2 may be 0.5 or less of the height H1. The first convex portion P1 or the first convex surface may include a hemispherical shape, a semi-circle or semi-elliptical shape, an aspherical shape, or a shape having a curved surface. The second convex portion P2 or the second convex surface may include a hemispherical shape, a semi-circular or semi-elliptical shape, an aspherical shape, or a shape having a curved surface. Here, when the first and second convex portions P1 and P2 have a lens shape, the focal length f may be obtained as follows. To explain at the focal length f, it has a relationship of $1/f=(n-1) \times (1/R1-1/$ R2), the R1 is a radius of curvature of the first convex portion P1, and the R2 is a radius of curvature of the second convex portion P2, and the n may be the refractive index of a material of the resin layer. The radius of curvature of the first and second convex portions P1 and P2 is proportional to f (D2 or D5), and may be considered with the half-maximum angle of each light emitting. The D2 is the maximum distance between the first convex portion and the first light emitting device, and the D5 is the maximum distance between the second convex portion and the second light emitting device. Here, the radius of curvature of the second convex portion P2 may be smaller than the radius of curvature of the first convex portion P1.

The area of the upper surface or the lower surface of the first convex portion P1 may be at least twice the area of the upper surface or the lower surface of the second convex portion P2, for example, in the range of 2 times to 10 times. The maximum length W1 of the first convex portion P1 in the second direction X may be greater than the maximum length W2 of the second convex portion P2, for example, the length W2 may be 0.5 times or less, or in the range of 0.5 times to 0.1 times the length W1. The maximum length W2 of the second exit surface S13 in the second direction X may be equal to or greater than the maximum length of the second light emitting device 103. The length W2 may be 6 mm or less, for example, in the range of 1 mm to 6 mm. That is, since the maximum length W2 in the second direction X of the second exit surface S13 is provided to be relatively smaller than the maximum length W1 in the second direction X of the first exit surface S11, the luminous intensity of the light emitted through the second exit surface S13 may be improved without affecting the luminous intensity of the first exit surface S11.

A first radius of curvature of the first exit surface S11 or the first convex surface may be different from a second radius of curvature of the second exit surface S13 or the second convex surface. The second radius of curvature may be greater than the first radius of curvature, for example, 0.5 times or less, or in a range of 0.5 times to 0.1 times the first radius of curvature. The first curvature of the first convex surface and the second curvature of the second convex surface may be different from each other, and the second curvature may be greater than or equal to twice the first curvature. Each of the second convex surface or the second convex portion P2 may be disposed between the first convex surface or the first convex portion P1, respectively.

As shown in FIG. 11, a virtual first circle Q4 passing through the first and second points Pa, Pb and/or the third point Pc of the first convex portion P1, the first convex surface or the first emission surface S11 may overlap the first light emitting device 101. The first and second points Pa and Pb may be disposed at positions symmetrical to each other with respect to the third point Pc or may be spaced apart from each other by the same distance. A virtual second circle Q5 passing through at least two of the fourth, fourth, and fifth points Pd and Pe and the sixth point Pf of the second convex portion P2, the second convex surface or the second exit surface S13 may be spaced apart from the second light emitting device 103 without overlapping. The fourth and fifth points Pd and Pe may be disposed at positions symmetrical to each other with respect to the sixth point Pf or may be spaced apart from each other by the same distance. The fourth and fifth points Pd and Pe may be a boundary point between the second convex part P2 and the first convex part P1, or may be both ends of the second direction X of the second emitting surface S13. The sixth point Pf may be a center point or an apex of the second convex portion P2.

Here, a portion of the first light emitting device 101 may be disposed in the first virtual circle Q4 passing through the first convex portion P1. The first virtual circle Q4 may have a diameter equal to or greater than the maximum length W1 of the first convex portion P1 or the first emission surface S11. The first virtual circle Q4 may pass through at least two of the points Pa, Pb, and Pc of the first convex portion P1 or the first emission surface S11 with respect to the center and may be a circle having radius Rr. The first emission portion 111 of the first light emitting device 101 may be disposed in the region of the first virtual circle Q4. A diameter of the first virtual circle Q4 may be greater than the maximum length D2. The diameter of the first imaginary circle Q4 constituting the first convex portion P1 may be equal to or greater than the maximum length W1 in the second direction X of the first convex portion P1 or the first exit surface S11. The first central axis Ya passing through the center of the first convex portion P1 or the center of the virtual circle Q4 and the center of the first light emitting device 101 may be parallel to the second central axis Yb passing through the center of the second exit surface 113 and the center of the second light emitting device 103, or converged toward a randomly focal point.

Figure 23:
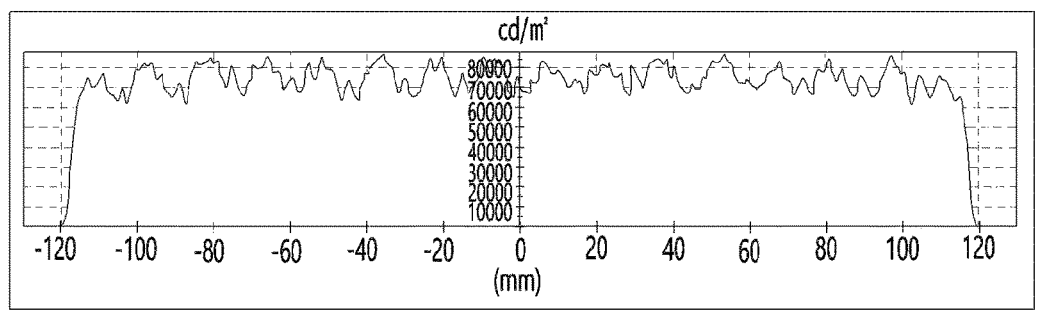
FIG. 23 is a diagram illustrating a light distribution of the lighting device of FIG. 9.

As shown in FIGS. 9 and 23, the luminance distribution of the light emitted through the convex second exit surface S13 from the resin layer 220 in the lighting device may be irradiated with 80% or more, for example, 85% or more based on the luminance distribution of the light emitted through the convex first exit surface S11. Accordingly, the difference between the luminance distribution of the light emitted to the first exit surface S11 and the luminance distribution of the light emitted through the second exit surface S13 may be 20% or less or 15% or less, so that the dark portion on the external image may be not recognized. The uniformity of the total light of such a lighting device may be improved to 90% or more.

In the above embodiment, the second light emitting device 103 or the second row in which they are arranged may be disposed to be more spaced apart from the second light exit surface S12 and S13 than the first light emitting device 101. As another example, referring to FIG. 12, the second light emitting device 104 may be disposed closer to the second exit surface S12 than the first light emitting device 101. That is, since the area of the second exit surface S12 is smaller than that of the first exit surface S11, by disposing the second light emitting device 104 closer to the second exit surface S12, the luminance distribution emitted through the second exit surface S12 may be further improved. The distance D6 between the second light exit surface S12 and the second light emitting device 104 may be 3 mm or more and may be smaller than the minimum distance between the first light emitting device 101 and the second light exit surface S12.

Figure 13:
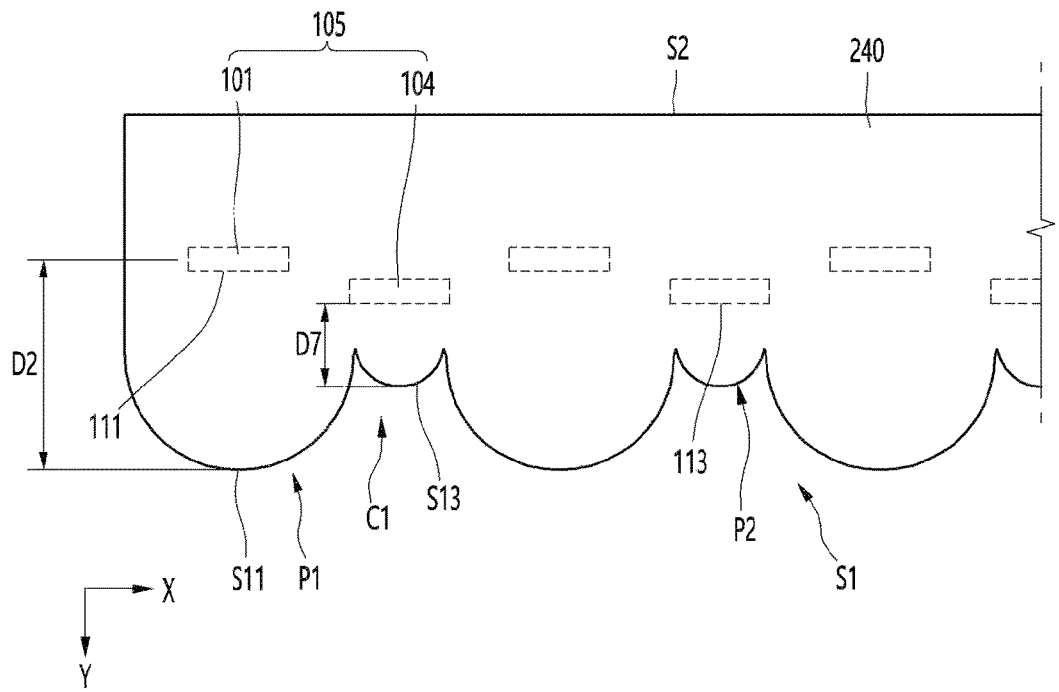
FIG. 13 is a plan view illustrating another example of the lighting device of FIG. 10.

Referring to FIG. 13, the second light emitting device 104 may be disposed closer to the second exit surface S13 than the first light emitting device 101. That is, since the area of the second exit surface S13 is smaller than that of the first exit surface S11, by disposing the second light emitting device 104 closer to the second exit surface S13, the luminance distribution emitted through the second exit surface S13 may be further improved. The distance D7 between the second light exit surface S13 and the second light emitting device 104 may be 3 mm or more and may be smaller than the minimum distance between the first light emitting device 101 and the second light exit surface S13.

Figure 12:
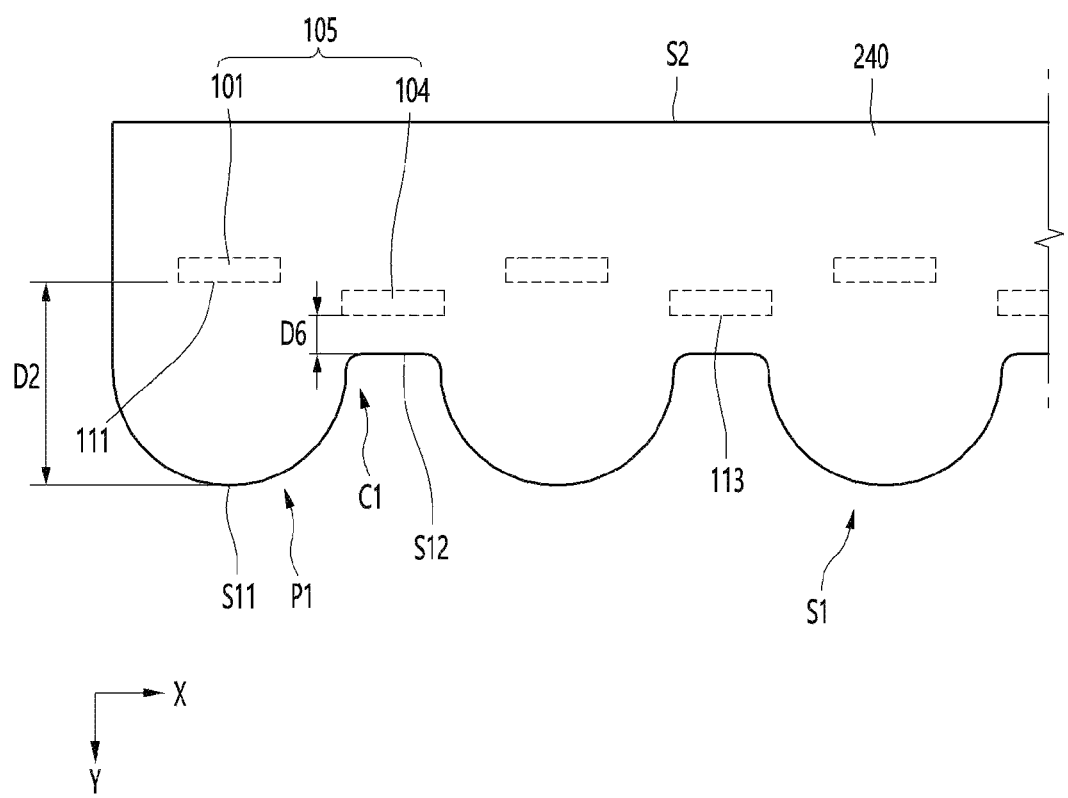
FIG. 12 is a plan view illustrating another example of the lighting device of FIG. 2.

As shown in FIGS. 12 and 13, since the position of the second light emitting device 104 facing the second exit surfaces S12 and S13 are disposed closer than the distance D1 between the first emission surface S11 and the first light emitting device 101 in consideration of the area of the second exit surfaces S12 and S13, the luminance distribution of the light emitted through the second exit surfaces S12 and S13 may be increased.

Figure 14:
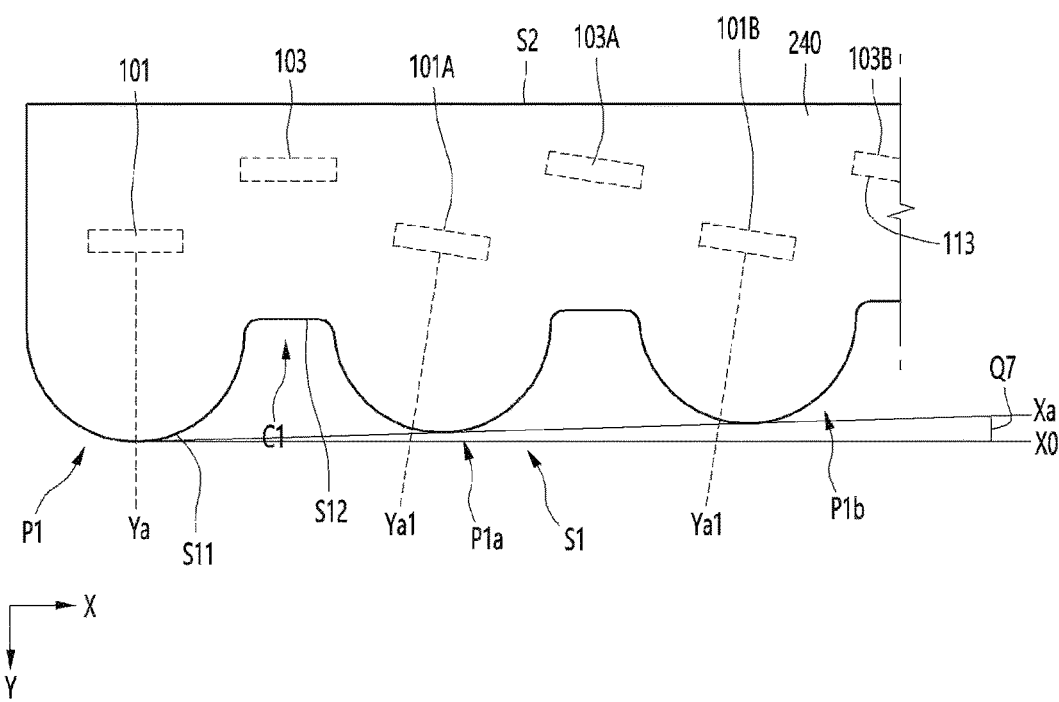
FIG. 14 is a plan view illustrating a third modified example of a lighting device according to an embodiment of the invention.

Referring to FIG. 14, at least one or two or more of the first light emitting devices 101, 101A and 101B in the first row in the lighting device may be tilted or disposed to be inclined as the distance from the fifth surface S5 increases. The center of the tilted light emitting devices 101A and 101B is tilted from the center of each of the convex portions P1a and P1b or the central axis Y1 a passing through the center of a circle formed by each of the convex portions P1 a and P1b, and may be converged to the central axis Ya and the focal length. The straight line Xa connecting the apexes of the first convex portions P1a and P1b facing to the tilted first light emitting devices 101A and 101B is not tilted, or may have a tilted or inclined angle Q7 toward the second surface rather than a straight line X0 extending in the second direction X based on the apex of the first convex portion P1 facing to the first light emitting device 101 adjacent to the fifth surface S5. The second light emitting devices 103A and 103B disposed between the tilted first light emitting devices 101A and 101B or in a direction away from the fifth surface S5 may be disposed to be tilted. The tilted first light emitting devices 101A and 101B and the second light emitting devices 103A and 103B may be tilted at the same angle or at different angles. Such a lighting device arranges at least one or two or more tilted light emitting devices in the first row and/or second row in the resin layer, so that the light emitting devices are arranged in a direction in which the distribution of the angle of beam spread may be converged.

Figure 15:
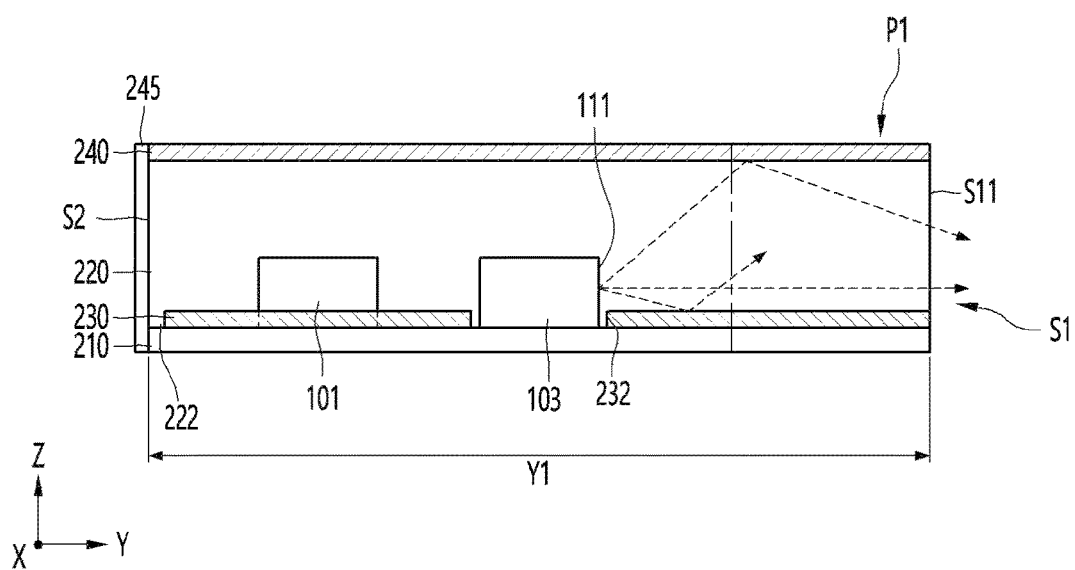
FIG. 15 is a side cross-sectional view illustrating a fourth modified example of a lighting device according to an embodiment of the invention.

FIG. 15 is another example of the lighting device of the invention. As shown in FIG. 15, the first reflective layer 230 may be spaced apart from the edge of the substrate 210, and a portion 222 of the resin layer 220 may be in contact with an edge-side upper surface of the substrate 210. When the resin layer 220 is in contact with the edge of the substrate 210, moisture penetration may be suppressed. As another example, in the lighting device shown in FIGS. 2 and 15, a third reflective layer 245 may be further disposed on surfaces S2, S3, and S4 of the resin layer 220 except for the first surface S1. The third reflective layer 245 may prevent light leakage and increase the amount of light extracted to the first surface S1. The third reflective layer 245 may be made of the above-described first and second reflective layers 230 and 240. The third reflective layer 245 may be in contact with or spaced apart from the side surface of the resin layer 220.

Figure 16:
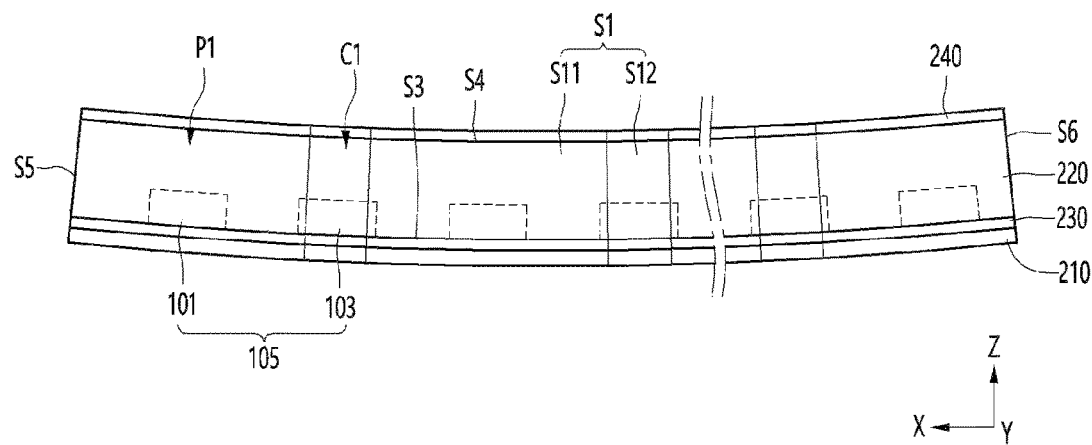
FIGS. 16 and 17 are views showing flexible examples of lighting devices according to the embodiment(s) of the invention.
Figure 17:
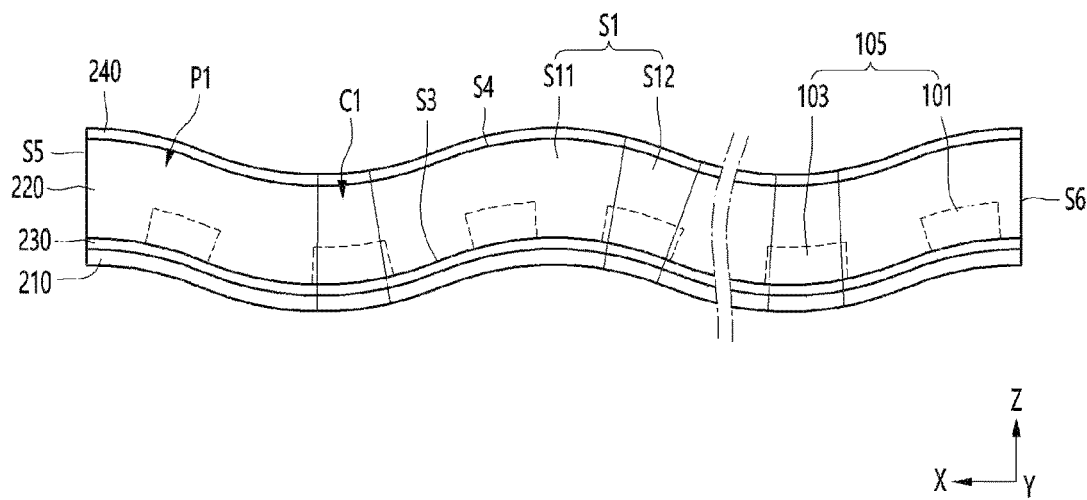

As shown in FIG. 16, the lighting device according to the embodiment may be convexly curved in the down direction or the substrate direction, or convexly curved in the up direction or the second reflective layer direction, as it approaches the center region with respect to the fifth and sixth surfaces S5 and S6. As shown in FIG. 17, the lighting device according to the embodiment may include a convex region convex in an up direction or a second reflection layer direction from the fifth surface S5 to the sixth surface S6, and at least one concave region in a down direction or a substrate direction between the convex regions or the convex region and adjacent region. The convex region and the concave region may be alternately arranged with each other.

Figure 18:
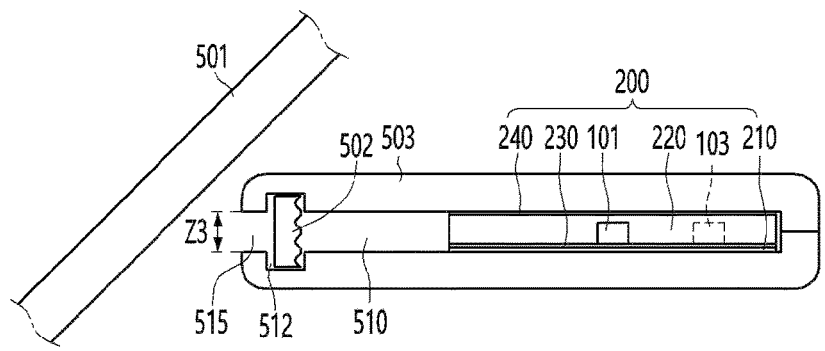
FIG. 18 is an example of a lamp to which a lighting device according to an embodiment of the invention is applied.

In the embodiment of the invention, when the thickness of the resin layer 220 is provided to be thick, for example, in a range of 3 mm to 6 mm, the light emitting area is increased due to the increase in the thickness of the resin layer 220, so that the light distribution may be improved. The lighting device according to an embodiment of the invention may be applied to a lamp as shown in FIG. 18. The lamp is an example of a vehicle lamp, and is applicable to a head lamp, a side lamp, a side mirror lamp, a fog lamp, a tail lamp, a brake lamp, a daytime running lamp, a vehicle interior lighting, a door scar, a rear combination lamp, or backup lamps.

Referring to FIG. 18, the lighting device 200 having the first and second light emitting devices 101 and 103 described above may be coupled to the lamp inside a housing 503 having an inner lens 502. The thickness of the lighting device 200 is such that it may be inserted into the inner width of the housing 503. The width Z3 of the emission portion 515 of the inner lens 502 may be equal to or equal to or less than twice the thickness of the lighting device 200, thereby preventing a decrease in luminous intensity. The inner lens 502 may be spaced apart from the front surface of the lighting device 200 by a predetermined distance, for example, 10 mm or more. An outer lens 501 may be disposed on the emission side of the inner lens 502. The lamp having the lighting device 200 is an example, and may be applied to other lamps in a flexible structure, for example, a curved surface or a curved structure when viewed from the side.

Figure 19:
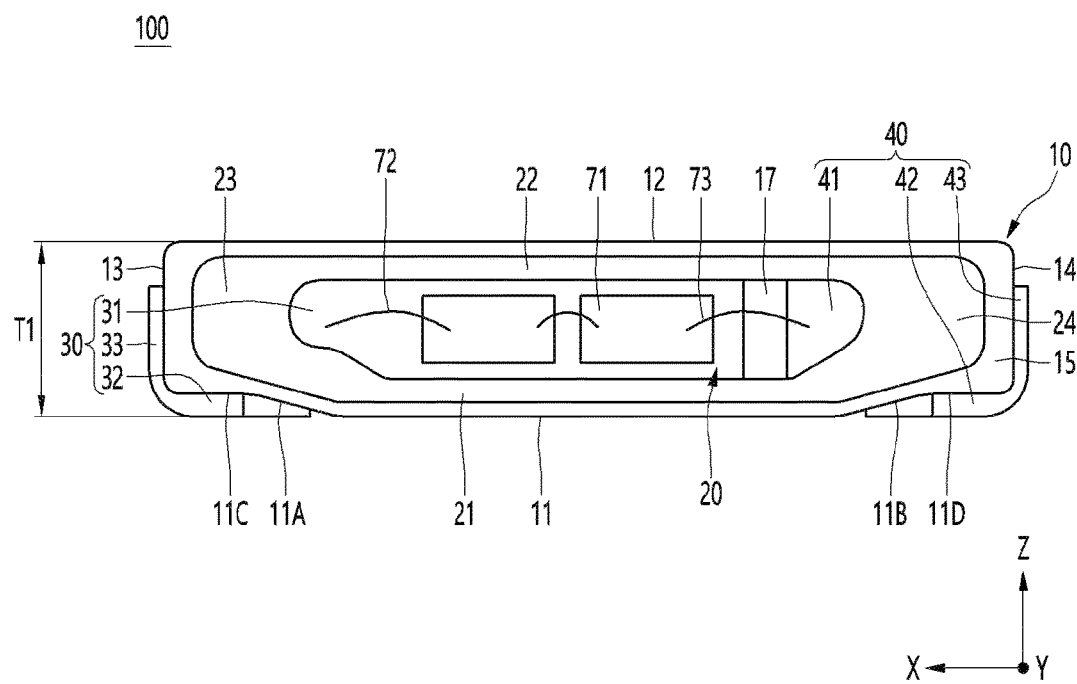
FIG. 19 is an example of a front view of a light emitting device applied to a lighting device according to an embodiment of the invention.
Figure 20:
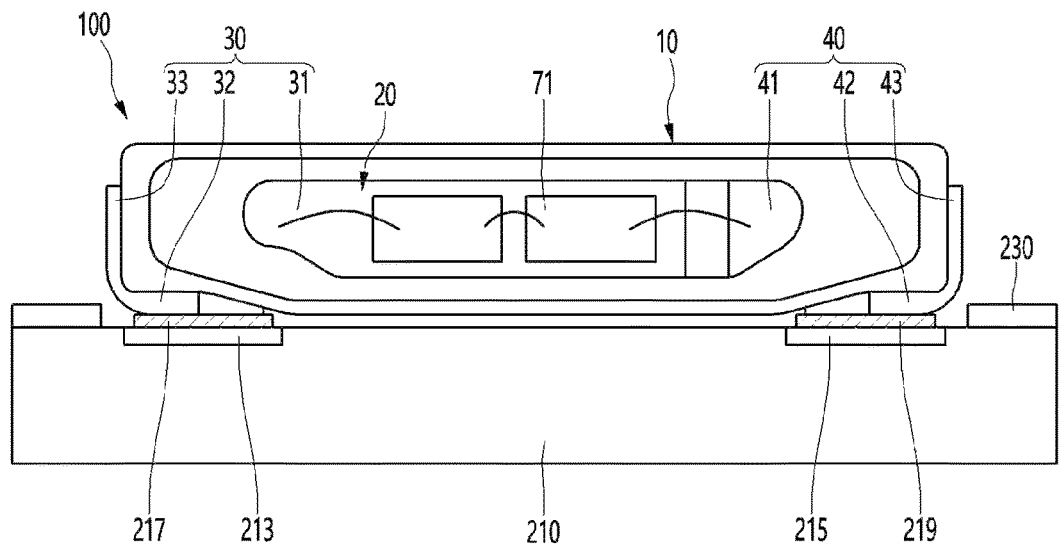
FIG. 20 is an example of a device in which the light emitting device of FIG. 19 is disposed on a substrate.
Figure 21:
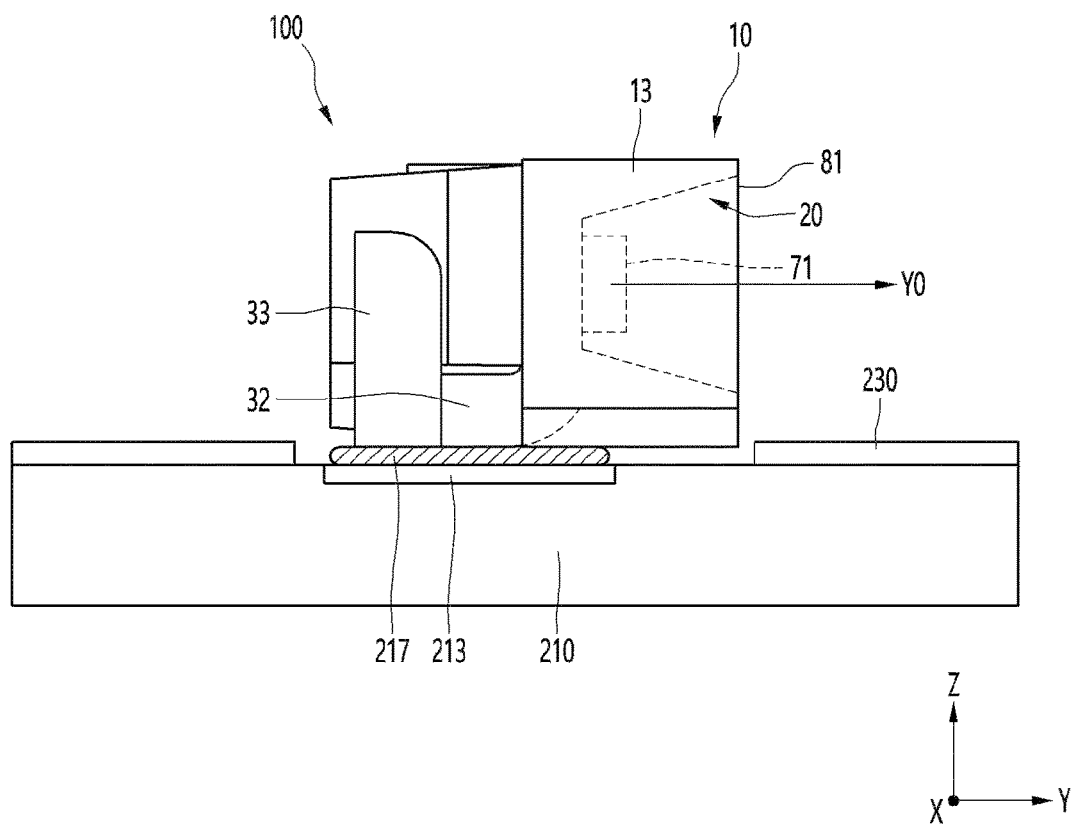
FIG. 21 is a view of the device of FIG. 20 viewed from the other side.

FIG. 19 is a plan view showing an example of a light emitting device applied to a lighting device according to an embodiment of the invention, FIG. 20 is FIG. 19 is an example of a device in which the light emitting device is disposed on a substrate, and FIG. 21 is a view of the device of FIG. 20 viewed from the other side Referring to FIGS. 19 to 21, the light emitting device 100 includes a body 10 having a cavity 20, a plurality of lead frames 30 and 40 in the cavity 20, and one or a plurality of light emitting chips 71 disposed on at least one of the plurality of lead frames 30 and 40. The light emitting device 100 is an example of the light emitting device disclosed in the above embodiment and may be implemented as a side-view type light emitting package. The light emitting device 100 may have a length in the second direction of three times or more, for example, four times or more than the width of the first direction. The length of the first direction may be 2.5 mm or more, for example, in a range of 2.7 mm to 6 mm. The light emitting device 100 may provide a long length in the second direction, thereby reducing the number of light emitting devices 100 in the second direction. The light emitting device 100 may provide a relatively thin thickness, thereby reducing the thickness of the lighting module having the light emitting device 100. The thickness of the light emitting device 100 may be 2 mm or less. The body 10 is provided with the cavity 20 and the length of the body 10 in the first direction may be three times or more compared to the thickness T1 of the body 10, thereby widening the angle of beam spread of light in the second direction. The lead frames 30 and 40 are disposed on the bottom of the cavity 20 of the body 10. For example, a first lead frame 30 and a second lead frame 40 are coupled to the body 10. The body 10 may be formed of an insulating material. The body 10 may be formed of a reflective material. The body 10 may be formed of a material having a reflectance higher than a transmittance with respect to a wavelength emitted from the light emitting chip 71, for example, a material having a reflectance of 70% or more. In the case in which the reflectance is 70% or more, the body 10 may be defined as a non-transparent material or a reflective material. The body 10 may be formed of a resin-based insulating material, for example, a resin material such as Polyphthalamide (PPA). The body 10 may be formed of a thermosetting resin including a silicone-based, epoxy-based, or plastic material, or a material having high heat resistance and high light resistance. The body 10 includes a reflective material, for example, a resin material to which a metal oxide is added, and the oxide may include at least one of $TiO_2$, $SiO_2$, and $Al_2O_3$. Such a body 10 may effectively reflect incident light. As another example, the body 10 may be formed of a resin material having a translucent resin material or a phosphor material converting a wavelength of incident light. The front portion 15 of the body 10 may be a surface on which the cavity 20 is disposed, or may be a surface on which light is emitted. The rear portion of the body 10 may be an opposite side of the front portion 15.

The first lead frame 30 includes a first lead portion 31 disposed at the bottom of the cavity 20, a first bonding portion 32 disposed on a first outer regions 11A and 11C of the first side portion 11 of the body 10, and a first heat radiating portion 33 disposed on the third side portion 13 of the body 10. The first bonding portion 32 is bent from the first lead portion 31 disposed in the body 10 and protrudes to the first side portion 11, and the first heat radiating portion 33 may be bent from the first bonding portion 32. The first outer regions 11A and 11C of the first side portion 11 may be a region adjacent to the third side portion 13 of the body 10. The second lead frame 40 includes a second lead portion 41 disposed on the bottom of the cavity 20, a second bonding portion 42 disposed on second outer regions 11B and 11D of the first side portion 11 of the body 10, and a second heat radiating portion 43 disposed on the fourth side portion 14 of the body 10. The second bonding portion 42 is bent from the second lead portion 41 disposed in the body 10 and the second heat radiating portion 43 may be bent from the second bonding portion 42. The second outer regions 11B and 11D of the first side portion 11 may be a region adjacent to the fourth side portion 14 of the body 10.

A gap portion 17 between the first and second lead portions 31 and 41 may be formed of a material of the body 10 and may be the same horizontal surface with the bottom of the cavity 20 or may protrude, but the invention is not limited thereto. The first outer regions 11A and 11C and the second outer regions 11B and 11D has an inclined regions 11A and 11B and a flat regions 11C and 11D. The first and second bonding portions 32 and 42 of the first and second lead frames 30 and 40 may protrude through the inclined regions 11A and 11B, but the invention is not limited thereto.

Here, the light emitting chip 71 may be disposed on, for example, the first lead portion 31 of the first lead frame 30. The light emitting chip 71 may be connected to the first and second lead parts 31 and 41 by wires 72 and 73, or the light emitting chip 71 may be adhesively connected to the first lead part 31 and connected to the second lead part 41 by wire. The light emitting chip 71 may be a horizontal chip, a vertical chip, or a chip having a via-structure. The light emitting chip 71 may be mounted in a flip chip manner. The light emitting chip 71 may selectively emit light within a wavelength range of an ultraviolet ray to a visible ray. The light emitting chip 71 may emit ultraviolet light or a blue peak wavelength, for example. The light emitting chip 71 may include at least one of Group II-VI compounds and Group III-V compounds. The light emitting chip 71 may be formed of a compound selected from the group consisting of GaN, AlGaN, InGaN, AlInGaN, GaP, AlN, GaAs, AlGaAs, InP and mixtures thereof. The light emitting chip 71 may be disposed in the cavity 20 in one or more. The plurality of light emitting chips 71 may be disposed on at least one of the first lead frame 30 and the second lead frame 40.

In an inner side of the cavity 20, first, second, third and fourth inner sides 21, 22, 23 and 24 disposed around the cavity 20 may be inclined with respect to a horizontal straight line of an upper surface of the lead frames 30 and 40. A first inner side 21 adjacent to the first side portion 11 and a second inner side 22 adjacent to the second side portion 12 is inclined at an angle to the bottom of the cavity 20, and a third inner side 23 adjacent to the third side portion 13 and a fourth inner side 24 adjacent to the fourth side portion 14 may be inclined at an angle smaller than the inclination angle of the first and second inner sides 21 and 22. Accordingly, the first and second inner sides 21 and 22 reflect the progress of the incident light toward the first axis direction Y, and the third and fourth inner sides 23 and 24 may diffuse the incident light in the second axis direction X.

The inner side surfaces 21, 22, 23 and 24 of the cavity 20 may have a stepped region vertically stepped from the front side portion 15 of the body 10. The stepped region may be disposed to be stepped between the front side portion 15 of the body 10 and the inner sides 21, 22, 23 and 24. The stepped region may control the directivity characteristic of the light emitted through the cavity 20. The light emitting chip 71 disposed in the cavity 20 of the light emitting device 100 according to the embodiment may be arranged in one or a plurality. The light emitting chip 71 may be selected from, for example, a red LED chip, a blue LED chip, a green LED chip, and a yellow green LED chip.

A molding member 81 is disposed in the cavity 20 of the body 11 as shown in FIG. 42, and the molding member 81 includes a light-transmitting resin such as silicone or epoxy, and may be formed in a single layer or multiple layers. A phosphor for changing a wavelength of light emitted on the molding member 81 or the light emitting chip 71 may be included, and the phosphor excites and emits a portion of the light emitted from the light emitting chip 71 to obtain a different wavelength. The phosphor may be selectively formed from quantum dots, YAG, TAG, Silicate, Nitride, and Oxy-nitride-based materials. The phosphor may include at least one of a red phosphor, a yellow phosphor, and a green phosphor, but is not limited thereto. The surface of the molding member 81 may be formed in a flat shape, a concave shape, a convex shape, etc., but is not limited thereto. As another example, a light-transmitting film having a phosphor may be disposed on the cavity 20, but is not limited thereto.

A lens may be further formed on the upper portion of the body 10, and the lens may include a concave or convex lens structure, and may control light distribution of light emitted by the light emitting device 100. A semiconductor device such as a light receiving device or a protection device may be mounted on the body 10 or any one of the lead frames, and the protection device may be implemented as a thyristor, a Zener diode, or a TVS (Transient Voltage Suppression), and the Zener diode protects the light emitting chip 71 from electrostatic discharge (ESD).

Referring to FIGS. 20 and 21, at least one or a plurality of light emitting devices 100 are disposed on a substrate 210, and a first reflective layer 230 is disposed around a lower portion of the light emitting devices 100. The light emitting device 100 may be applied to the lighting module disclosed above as an example of the light emitting device disclosed in the embodiment. The first and second lead portions 33 and 43 of the light emitting device 100 are bonded to the electrode patterns 213 and 215 of the substrate 210 with solder or conductive tape, which are conductive adhesive members 217 and 219.

The characteristics, structures and effects described in the above-described embodiments are included in at least one embodiment but are not limited to one embodiment. Furthermore, the characteristic, structure, and effect illustrated in each embodiment may be combined or modified for other embodiments by a person skilled in the art. Thus, it would be construed that contents related to such a combination and such a modified example are included in the scope of the invention.

An embodiment of the invention may provide a lighting module and a lighting device irradiated with line-shaped surface light. An embodiment of the invention may provide a lighting module and a lighting device in which a resin layer having a light emitting device is disposed between a plurality of reflective layers. An embodiment of the invention may provide a lighting module and a lighting device in which a resin layer having a plurality of light emitting devices disposed in different rows between a plurality of reflective layers is disposed. An embodiment of the invention may provide a lighting module and a lighting device that emit light having a predetermined intensity or more through at least one side surface of a resin layer having a light emitting device. An embodiment of the invention may provide a lighting module or a lighting device that provides a plurality of first convex portions respectively facing to the first light emitting devices as one side surface of the resin layer. An embodiment of the invention may include a flat portion or a second convex portion facing the second light emitting devices, respectively, between the plurality of first convex portions disposed on one side surface of the resin layer. An embodiment of the invention provides a lighting module for irradiating a line-shaped side light source or a surface light source, and a lighting device having the same. An embodiment of the invention may provide a light unit having a lighting module, a liquid crystal display, and a vehicle lamp.

Technical Solution

A lighting device according to an embodiment of the invention includes: a substrate; a plurality of light emitting devices disposed on the substrate; a first reflective layer disposed on the substrate; a resin layer disposed on the first reflective layer; and a second reflective layer disposed on the resin layer, wherein the resin layer includes a first surface from which light emitted from the plurality of light emitting devices is emitted, and a second surface opposite to the first surface, The first surface of the resin layer includes a first exit surface having a first curvature, and a second exit surface having a flat surface or a second curvature, and the maximum distance from the second surface to the first exit surface may greater than the maximum distance from the second surface to the second exit surface.

A lighting device according to an embodiment of the invention includes: a substrate; a plurality of light emitting devices disposed on the substrate; a first reflective layer disposed on the substrate; a resin layer disposed on the first reflective layer; and a second reflective layer disposed on the resin layer, wherein the resin layer includes a first surface from which light emitted from the plurality of light emitting devices is emitted, and the plurality of light emitting devices includes a first light emitting device disposed in a first row and a second light emitting device disposed in a second row, wherein the first surface of the resin layer has a first convex surface facing to the first light emitting device and having a first curvature, and a second convex surface facing to the second light emitting device and having a second curvature, and a size of the first curvature may be different from a size of the second curvature.

A lighting device according to an embodiment of the invention includes: a substrate; a light emitting device including a first light emitting device and a second light emitting device disposed on the substrate; a first reflective layer disposed on the substrate; a resin layer disposed on the first reflective layer; and a second reflective layer disposed on the resin layer, wherein the resin layer includes a first surface from which light emitted from the first light emitting device and the second light emitting device is emitted, wherein the first surface of the resin layer includes a convex first exit surface and a convex second exit surface, and the first exit surface and the second exit surface include first and second points adjacent to each other, and a third point that is an apex. The first and second points are symmetrical with respect to the third point, and the first light emitting device overlaps with a virtual first circle passing at least two of the first, second, and third points of the first exit surface, and the second light emitting device may not overlap with a virtual second circle passing at least two of the first point, the second point, and the third point.

According to an embodiment of the invention, the radius of curvature of the second exit surface may be 0.5 times or less than the radius of curvature of the first exit surface. According to an embodiment of the invention, the first surface is an outer surface of the resin layer between the first and second reflective layers in the first direction, and a surface opposite to the first surface in the first direction is the second surface, wherein a plurality of the first exit surfaces are disposed, the second exit surfaces are respectively disposed between the first exit surfaces, and the plurality of light emitting devices includes a plurality of first light emitting devices adjacent to the first surface, and the a plurality of second light emitting devices adjacent to the second surface, wherein the plurality of first light emitting devices overlap each of the first light exit surfaces in a first direction, and the plurality of second light emitting devices includes the second light emitting devices may overlap each of the second exit surfaces in the first direction. The plurality of second light emitting devices may be disposed closer to the second surface than the first light emitting device, and the plurality of first and second light emitting devices may be arranged in different rows. The first and second light emitting devices may be disposed not to overlap in the first direction, and a length of the second light emitting device in a second direction orthogonal to the first direction may be smaller than a maximum length of the first exit surface. A length of the second light emitting device in the second direction orthogonal to the first direction may be smaller than a maximum length of the second exit surface. According to an embodiment of the invention, the maximum distance from the center of the first light emitting device to the first exit surface may be equal to or greater than the maximum distance from the center of the second light emitting device to the second exit surface.

According to an embodiment of the invention, the thickness of the resin layer may be equal to or less than the maximum length of the second exit surface, and the height of the first surface may be the same as the thickness of the resin layer. The maximum length of the second exit surface has a range of 0.1 times to 0.5 times the maximum length of the first exit surface, the first exit surface may include a hemispherical shape or an aspherical shape. A plurality of the first exit surfaces is disposed between the first and second reflection layers in a second direction orthogonal to the first direction, and the second exit surfaces are respectively disposed between the plurality of first exit surfaces, wherein the substrate, the first reflective layer, and the second reflective layer may vertically overlap the first and second exit surfaces. The substrate, the resin layer, the first reflective layer, and the second reflective layer may include a recess portion concave in the direction of the first surface toward the second exit surface. The resin layer includes a third surface on the first reflective layer and a fourth surface under the second reflective layer, and the interval between the third and fourth surfaces may be the same as the distance between the first and second reflective layers.

According to an embodiment of the invention, the lighting device may provide a line-shaped surface light source and improve the luminous intensity of the light source. The dark portion of the surface light source may be reduced and light uniformity may be improved by the light emitting devices disposed in different rows in the lighting device. The light loss of the lighting device may be reduced and the light efficiency may be improved. Since the light source in the form of a line is provided through one side of the lighting device having a thin thickness, the degree of freedom in design of the lighting module may be increased.

According to an embodiment of the invention, it is possible to improve the optical reliability of a lighting module and a lighting device having the same. It is possible to improve the reliability of a vehicle lighting device having the lighting module. It may be applied to a light unit having the above lighting module, various types of display devices, a surface light source lighting device, and a vehicle lamp.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A lighting device comprising:
a substrate;
a plurality of light emitting devices disposed on the substrate;
a first reflective layer disposed on the substrate;
a resin layer disposed on the first reflective layer; and
a second reflective layer disposed on the resin layer,
wherein the resin layer includes a first surface from which light emitted from the plurality of light emitting devices is emitted, and a second surface opposite to the first surface,
wherein the resin layer includes a third surface and a fourth surface opposite to the third surface,
wherein the resin layer is disposed between the first reflective layer and the second reflective layer,
wherein the third surface of the resin layer is disposed on the first reflective layer,
wherein the second reflective layer is disposed on the fourth surface of the resin layer,
wherein the plurality of light emitting devices includes a first light emitting device disposed in a first row and a second light emitting device disposed in a second row,
wherein the first surface of the resin layer includes a first exit surface facing to the first light emitting device and having a first curvature, and a second exit surface facing to the second light emitting device and having a flat surface or a second curvature,
wherein a plurality of first light emitting devices is arranged in the first row, and
wherein a plurality of second light emitting devices is arranged in the second row.

2. The lighting device of claim 1,
wherein the first exit surface has a same thickness as a thickness of the resin layer.

3. The lighting device of claim 2,
wherein the first exit surface is disposed between the first reflective layer and the second reflective layer.

4. The lighting device of claim 1, wherein the second exit surface has a same thickness as a thickness of the resin layer.

5. The lighting device of claim 4,
wherein the second exit surface is disposed between the first reflective layer and the second reflective layer, and
wherein a minimum distance between the first surface and the second surface is greater than the thickness of the resin layer.

6. The lighting device of claim 1,
wherein the resin layer includes a convex portion having the first exit surface,
wherein the convex portion includes an upper surface on which the third surface extends flat.

7. The lighting device of claim 6,
wherein the convex portion includes a lower surface on which the third surface extends flat.

8. The lighting device of claim 7,
wherein a thickness of the convex portion is equal to an interval between the first reflective layer and the second reflective layer.

9. The lighting device of claim 1,
wherein the resin layer includes a plurality of convex portions having the first exit surface, respectively,
wherein the plurality of convex portions is disposed between the first reflective layer and the second reflective layer.

10. A lighting device comprising:
a substrate;
a plurality of light emitting devices disposed on the substrate;
a first reflective layer disposed on the substrate;
a resin layer disposed on the first reflective layer; and
a second reflective layer disposed on the resin layer,
wherein the resin layer includes a first surface from which light emitted from the plurality of light emitting devices is emitted, and a second surface opposite to the first surface,
wherein the resin layer includes a lower surface and an upper surface opposite to the lower surface,
wherein the resin layer is disposed between the first reflective layer and the second reflective layer, wherein the lower surface of the resin layer is disposed on the first reflective layer, wherein the second reflective layer is disposed on the upper surface of the resin layer, wherein the plurality of light emitting devices is arranged in at least one row, wherein the first surface includes a plurality of first light exit surfaces facing each of the plurality of light emitting devices, and at least one second exit surface disposed between the plurality of first light exit surfaces, wherein each of the plurality of first exit surfaces includes a convex surface, wherein the resin layer includes a plurality of convex portions having each of the plurality of first exit surfaces, and wherein each of the plurality of convex portions includes a flat upper surface extending from the upper surface of the resin layer and a flat lower surface extending from the lower surface of the resin layer.

11. The lighting device of claim 10, wherein each of the plurality of first exit surfaces has a same thickness as a thickness of the resin layer.

12. The lighting device of claim 11, wherein each of the plurality of convex portions is disposed between the first reflective layer and the second reflective layer.

13. The lighting device of claim 10, wherein the second exit surface has a same thickness as a thickness of the resin layer.

14. The lighting device of claim 13, wherein the second exit surface is disposed between the first reflective layer and the second reflective layer.

15. The lighting device of claim 10, wherein the second surface is disposed between the first reflective layer and the second reflective layer and has a same thickness as a thickness of the resin layer.

16. The lighting device of claim 10, wherein the upper surface of each of the plurality of convex portions has a hemispherical shape.

17. The lighting device of claim 16, wherein the lower surface of each of the plurality of convex portions has a hemispherical shape.

18. The lighting device of claim 10, wherein the upper surface and the lower surface of each of the plurality of convex portions are parallel, wherein a minimum distance between the first surface and the second surface is greater than a thickness of the resin layer.

19. The lighting device of claim 10, wherein the second convex surface has a flat surface or a second curvature.

20. A lighting device comprising:
a substrate;
a plurality of light emitting devices disposed on the substrate;
a first reflective layer disposed on the substrate;
a resin layer disposed on the first reflective layer; and
a second reflective layer disposed on the resin layer,
wherein the resin layer includes a first surface from which light emitted from the plurality of light emitting devices is emitted, and a second surface opposite to the first surface,
wherein the resin layer includes a third surface and a fourth surface opposite to the third surface,
wherein the resin layer is disposed between the first reflective layer and the second reflective layer,
wherein the third surface of the resin layer is disposed on the first reflective layer,
wherein the second reflective layer is disposed on the fourth surface of the resin layer,
wherein the plurality of light emitting devices includes a first light emitting device disposed in a first row and a second light emitting device disposed in a second row,
wherein the first surface of the resin layer includes a first exit surface facing to the first light emitting device and having a first curvature, and a second exit surface facing to the second light emitting device and having a flat surface or a second curvature,
wherein the first exit surface has a same thickness as a thickness of the resin layer.

* * * * *